(12) United States Patent
Yoshikawa et al.

(10) Patent No.: US 10,230,042 B2
(45) Date of Patent: Mar. 12, 2019

(54) MAGNETORESISTIVE ELEMENT AND METHOD OF MANUFACTURING THE SAME

(71) Applicant: TOSHIBA MEMORY CORPORATION, Minato-ku, Tokyo (JP)

(72) Inventors: Masatoshi Yoshikawa, Seoul (KR); Hisanori Aikawa, Seoul (KR); Kazuhiro Tomioka, Seoul (KR); Shuichi Tsubata, Seoul (KR); Masaru Toko, Seoul (KR); Katsuya Nishiyama, Yokohama Kanagawa (JP); Yutaka Hashimoto, Seoul (KR); Tatsuya Kishi, Seongnam-si (KR)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/261,703

(22) Filed: Sep. 9, 2016

(65) Prior Publication Data

US 2017/0256705 A1 Sep. 7, 2017

Related U.S. Application Data

(60) Provisional application No. 62/303,331, filed on Mar. 3, 2016.

(51) Int. Cl.
*H01L 43/08* (2006.01)
*H01L 43/12* (2006.01)
*H01L 27/22* (2006.01)

(52) U.S. Cl.
CPC ............ *H01L 43/08* (2013.01); *H01L 43/12* (2013.01); *H01L 27/228* (2013.01)

(58) Field of Classification Search
CPC ......... H01L 43/08; H01L 43/02; H01L 43/12; H01L 27/22; H01L 43/222; G11C 14/0036; G11C 14/0081
See application file for complete search history.

(56) References Cited

U.S. PATENT DOCUMENTS

| 2004/0136231 A1* | 7/2004 | Huai .............. G11C 11/16 365/158 |
| 2008/0265347 A1 | 10/2008 | Iwayama et al. |
| 2011/0032645 A1 | 2/2011 | Noel et al. |

(Continued)

FOREIGN PATENT DOCUMENTS

| JP | 2013251336 A | 12/2013 |
| JP | 2014241449 A | 12/2014 |
| JP | 2016100417 A | 5/2016 |

*Primary Examiner* — Yasser A Abdelaziez
(74) *Attorney, Agent, or Firm* — Holtz, Holtz & Volek PC

(57) ABSTRACT

A magnetoresistive effect element according to one embodiment includes: a first magnetic layer; a nonmagnetic layer; a second magnetic layer; a metal layer; and a third magnetic layer. An area of a bottom of the third magnetic layer is larger than an area of a top of the third magnetic layer. An angle between the top of the third magnetic layer and a side of the third magnetic layer is larger than an angle between a top of the second magnetic layer and a side of the second magnetic layer, or an angle between the bottom of the third magnetic layer and a side of the third magnetic layer is smaller than an angle between the bottom of the second magnetic layer and a side of the second magnetic layer.

6 Claims, 32 Drawing Sheets

(56) References Cited

U.S. PATENT DOCUMENTS

| | | |
|---|---|---|
| 2013/0161770 A1* | 6/2013 | Meng ................... H01L 43/02 |
| | | 257/421 |
| 2013/0201755 A1 | 8/2013 | Ezaki |
| 2014/0087485 A1 | 3/2014 | Tomioka |
| 2014/0131649 A1 | 5/2014 | Daibou et al. |
| 2015/0200357 A1* | 7/2015 | Krounbi ................ H01L 43/12 |
| | | 257/421 |
| 2015/0280114 A1 | 10/2015 | Shen et al. |
| 2016/0013397 A1 | 1/2016 | Kitagawa et al. |
| 2016/0197268 A1 | 7/2016 | Yakabe et al. |
| 2017/0069686 A1* | 3/2017 | Nakatsuka ............ H01L 27/228 |

* cited by examiner

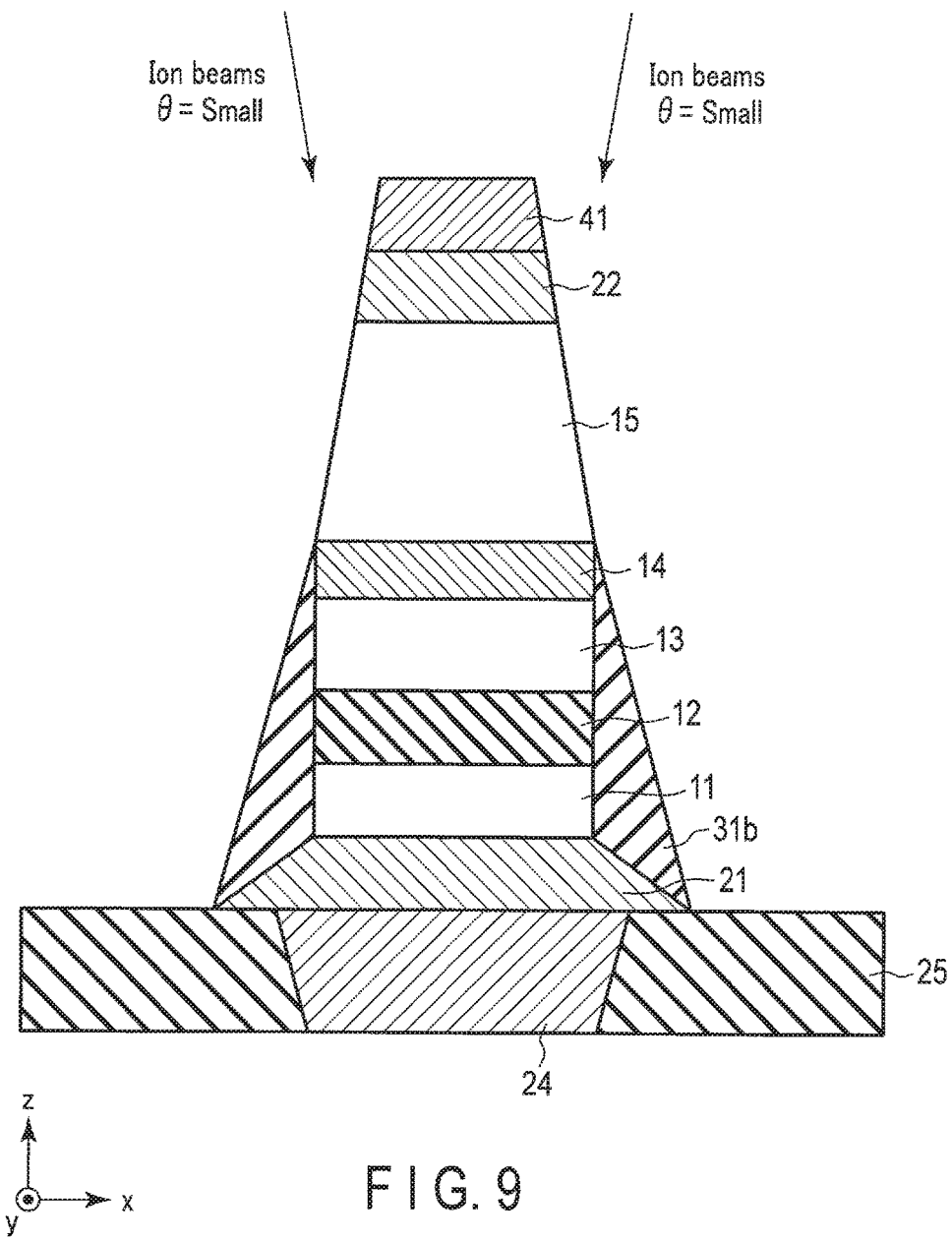
F I G. 9

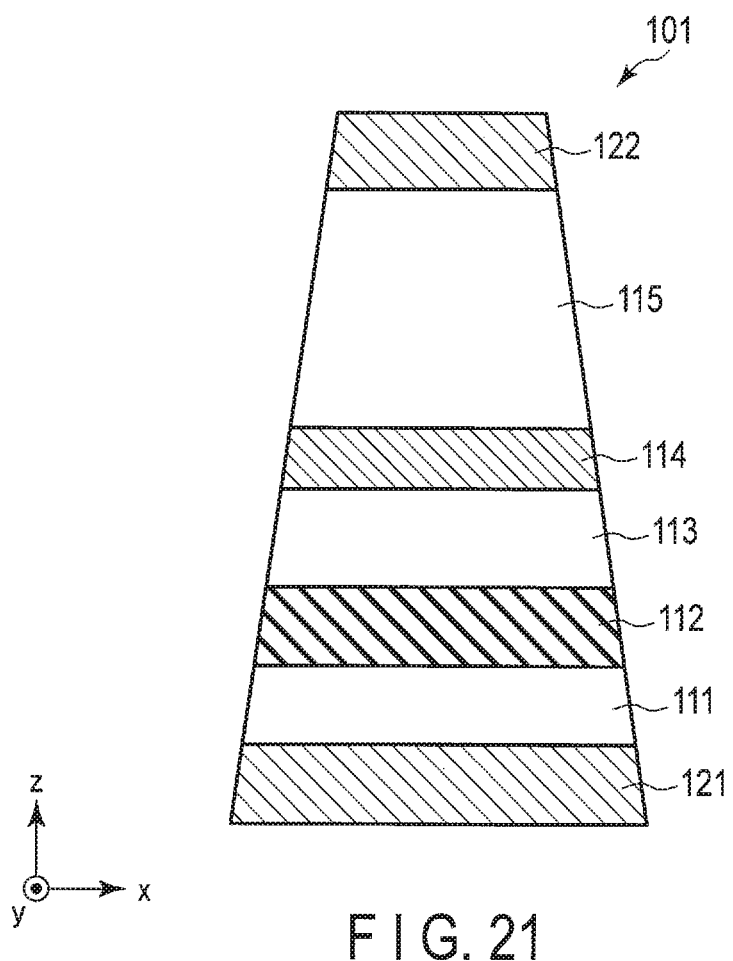
F I G. 21

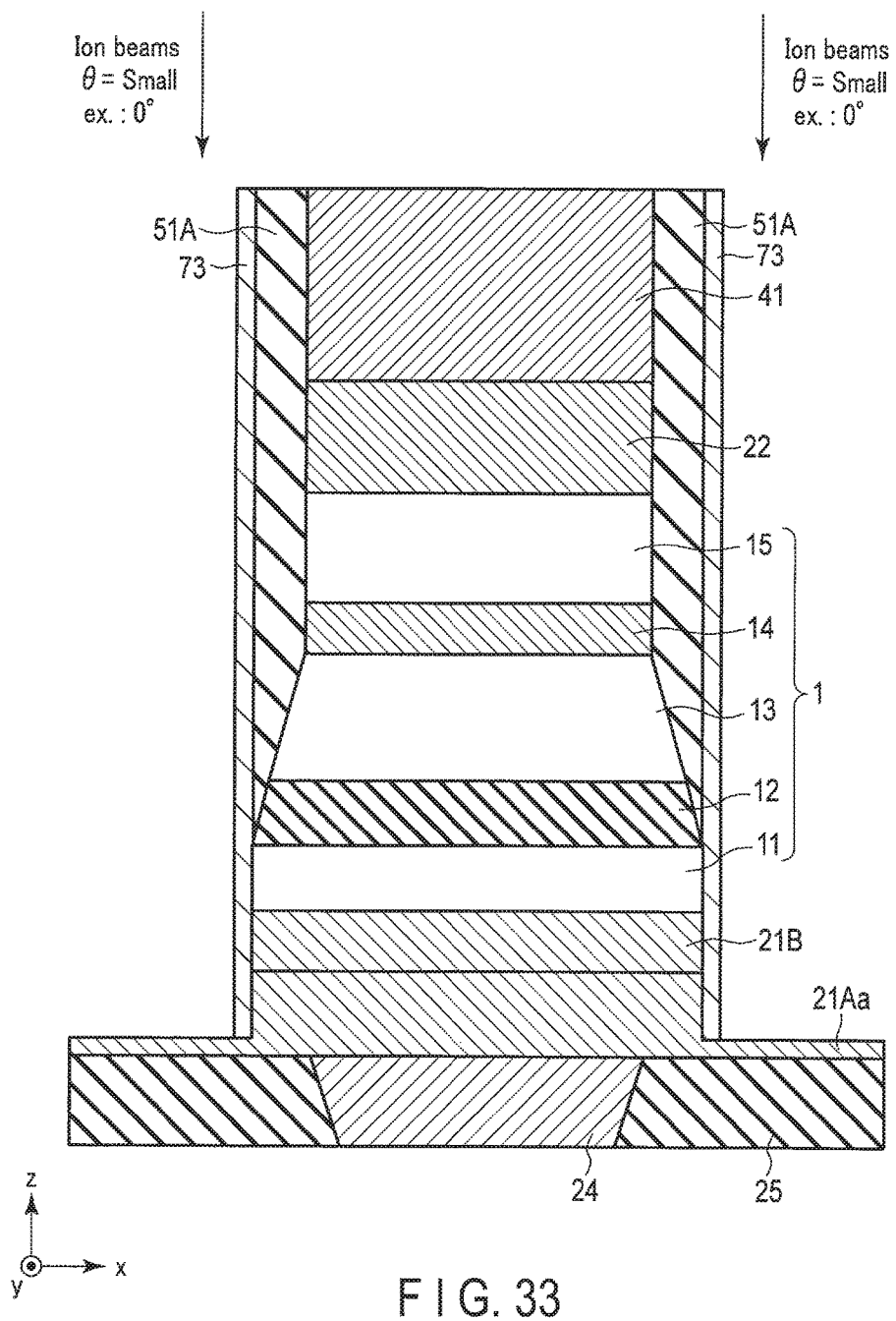
F I G. 33

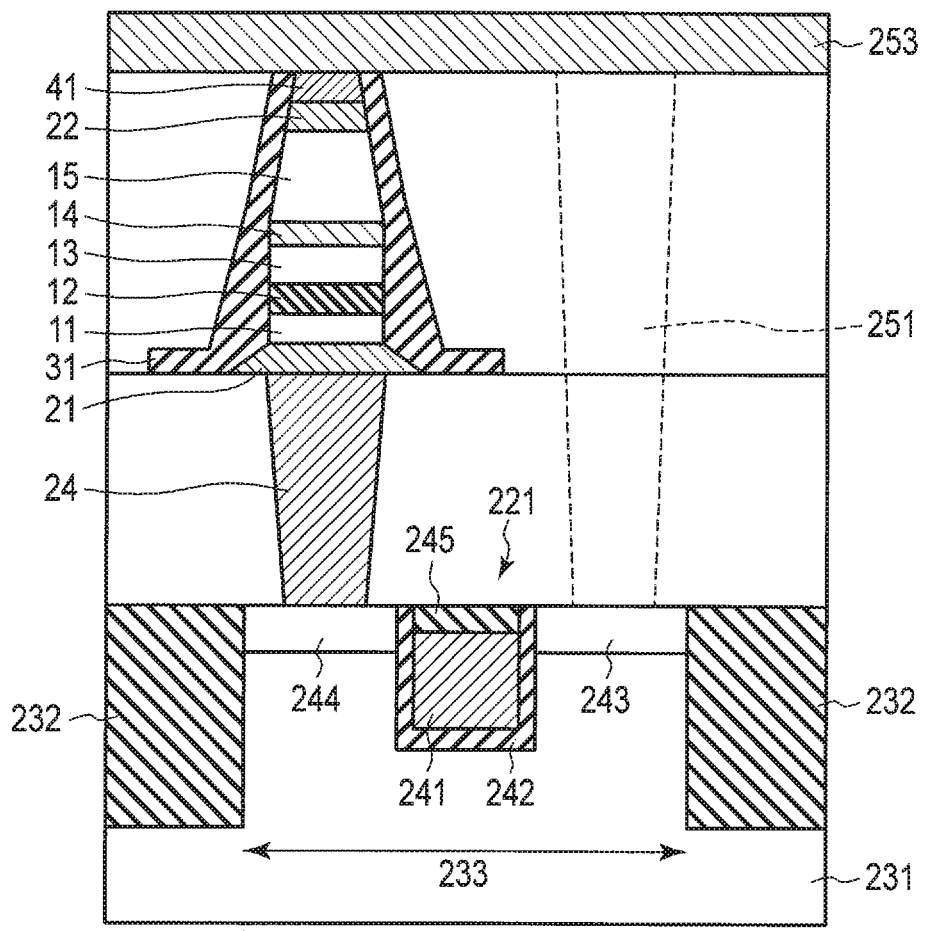
F I G. 36

MAGNETORESISTIVE ELEMENT AND METHOD OF MANUFACTURING THE SAME

CROSS-REFERENCE TO RELATED APPLICATIONS

This application claims the benefit of U.S. Provisional Application No. 62/303,331, filed Mar. 3, 2016, the entire contents of which are incorporated herein by reference.

FIELD

The embodiments described herein relate generally to a magnetoresistive effect element and a manufacturing method thereof.

BACKGROUND

Magnetoresistive effect elements which exhibit a resistance switchable based on the state thereof are known.

BRIEF DESCRIPTION OF THE DRAWINGS

FIG. 9 illustrates the state subsequent to FIG. 8;
FIG. 21 illustrates an actual stack of layers;
FIG. 33 illustrates the state subsequent to FIG. 32;
FIG. 36 illustrates a cross-section of the structure of a memory cell of the memory device of one embodiment.

DETAILED DESCRIPTION

Figure 1:
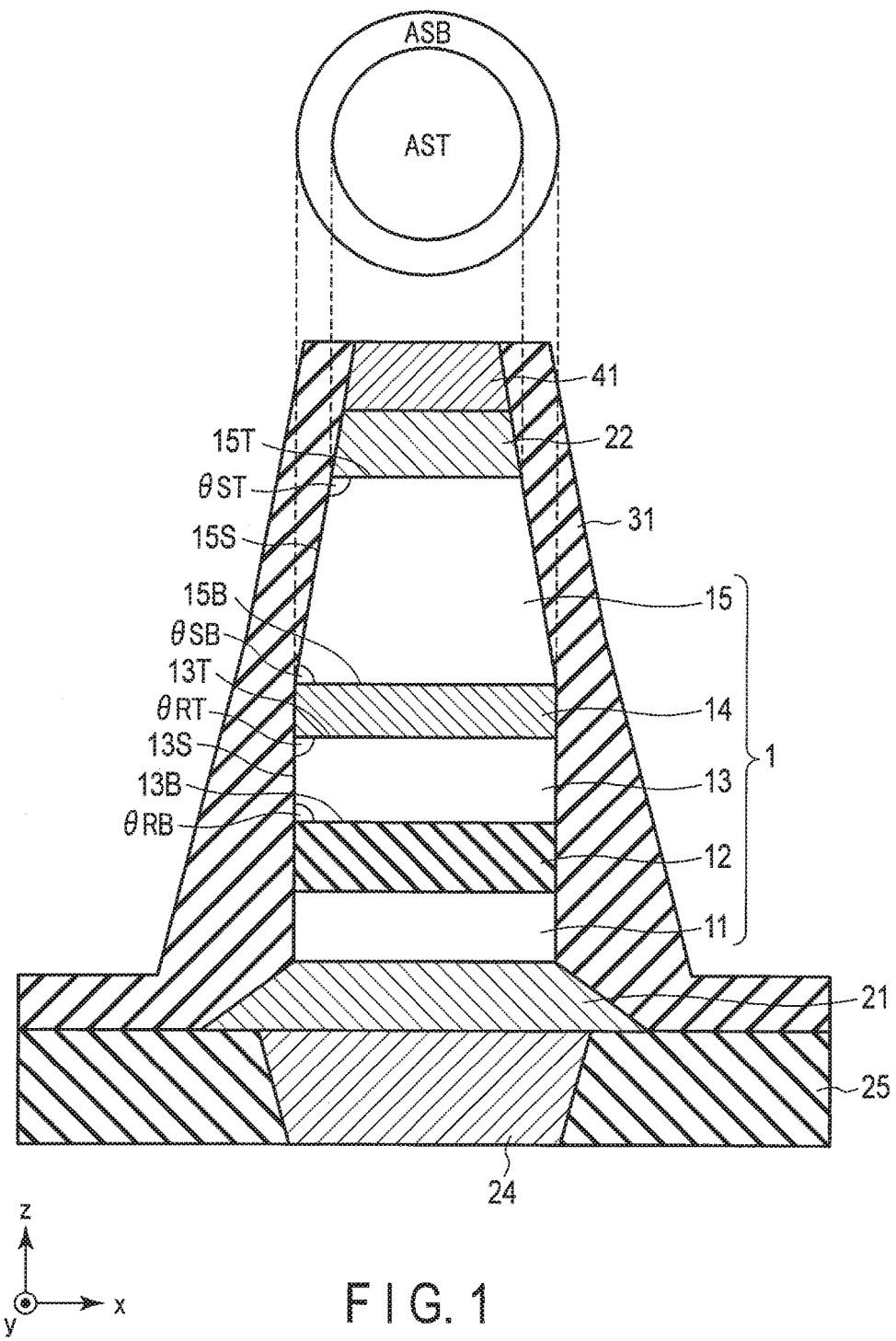
FIG. 1 illustrates a cross-section of an example of the structure of a magnetoresistive effect element of a first embodiment.

In general, according to one embodiment, a magnetoresistive effect element includes: a first magnetic layer; a nonmagnetic layer above the first magnetic layer; a second magnetic layer above the nonmagnetic layer; a metal layer above the second magnetic layer; and a third magnetic layer above the metal layer. An area of a bottom of the third magnetic layer is larger than an area of a top of the third magnetic layer. An angle between the top of the third magnetic layer and a side of the third magnetic layer is larger than an angle between a top of the second magnetic layer and a side of the second magnetic layer, or an angle between the bottom of the third magnetic layer and a side of the third magnetic layer is smaller than an angle between the bottom of the second magnetic layer and a side of the second magnetic layer.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of a layer and ratios of thicknesses of layers may differ from actual ones. The figures may include components which differ in relations and/or ratios of dimensions in different figures. Each embodiment illustrates devices and methods for embodying the technical idea of this embodiment, and the technical idea of the embodiment does not limit the types of the material, shapes, structures and arrangement of components to the following.

Any step in a flow of a method of an embodiment is not limited to any illustrated order, and can occur in an order different from an illustrated order and/or can occur concurrently with another step.

First Embodiment

FIG. 1 illustrates a cross-section of an example of the structure of a magnetoresistive effect element of the first embodiment. As illustrated in FIG. 1, a magnetoresistive effect element 1 includes a storage layer (film) 11, an intermediate layer 12, a reference layer 13, a coupling layer 14, and a shift control layer 15. The element 1 may include additional layers. FIG. 1 illustrates an example where the element 1 includes a base layer 21 and a cap layer 22 which sandwich the set of layers 11 to 15, and a hard mask 41. The storage layer 11 and the reference layer 13 sandwich the intermediate layer 12. The reference layer 13 and the shift control layer 15 sandwich the coupling layer 14. The storage layer 11, the intermediate layer 12, the reference layer 13, the coupling layer 14, and the shift control layer 15 are lined up along a z-axis.

The storage layer 11 includes or is formed of one or more conductive magnetic materials. Specifically, the storage layer 11 includes one or more elements, such as iron (Fe), boron (B), and cobalt (Co), or cobalt-iron-boron (CoFeB) or iron boride (FeB). The storage layer 11 may include the artificial grid. Alternatively, the storage layer 11 includes or is formed of an alloy of Co, Fe, and B. The CoFeB exhibits different properties according to the concentration of B. The composition of B in CoFeB for the storage layer 11 is lower than or equal to 30 at %.

The storage layer 11 is magnetized in a direction along a particular axis, and the magnetization of the storage layer 11 is stable along an axis which pierces through the layers 11, 12, and 13, such as an axis perpendicular to interface surfaces of the layers 11, 12, and 13. In other words, the storage layer 11 has the magnetic anisotropy along the axis which pierces through the layers 11, 12, and 13, such as the axis perpendicular to interface surfaces of the layers 11, 12, and 13, and has a so-called perpendicular magnetic anisotropy, for example. The magnetization of the storage layer 11 can stabilize in either of two directions along the magnetization easy axis. The orientation of the magnetization of the storage layer 11 can flip by a current (write current) flowing through the layers 11, 12, and 13.

The intermediate layer 12 includes or is formed of a nonmagnetic insulator and serves as a tunnel barrier. The intermediate layer 12 includes or is formed of magnesium oxide (MgO).

The reference layer 13 includes or is formed of a conductive magnetic material. The reference layer 13 can include or be formed of, for example, cobalt-platinum (CoPt), cobalt-nickel (CoNi), or cobalt-palladium (CoPd). Moreover, the reference layer 13 may include a stack of layers of different ones of Co, Pt, Pd, and Ni, or ordered alloy of these materials. Furthermore, the reference layer 13 may a layer of CoFeB alloy in the boundary with the intermediate layer 12. The reference layer 13 may be formed from the same material as the storage layer 11. The reference layer 13 has the perpendicular magnetic anisotropy as the storage layer 11. The reference layer 13 has magnetization with a fixed or invariable orientation, and has, for example, a larger coercivity than that of the storage layer 11. The "fixed" or "invariable" magnetization orientation of the reference layer 13 refers to the fact that the magnetization orientation of the reference layer 13 does not flip due to a write current which flips the magnetization orientation of the storage layer 11.

The set of the layers 11, 12, and 13 exhibits a magnetoresistive effect. Specifically, the magnetoresistive effect element 1 exhibits the minimum and maximum resistances when the magnetization orientation of the storage layer 11 and that of the reference layer 13 are parallel and antiparallel, respectively. Whether the magnetoresistive effect element 1 exhibits the higher or lower resistance, or the magnetization orientation of the storage layer 11 can be used to store data in a memory cell of a memory device, for example.

The shift control layer 15 has a function to suppress the magnetic field generated by the reference layer 13 and applied to the storage layer 11, i.e., a stray magnetic field. The shift control layer 15 includes or is formed of a conductive magnetic material. The shift control layer 15 can be the same or substantially the same material as that of the reference layer 13, for example.

The reference layer 13 generates a magnetic field which pierces through the intermediate layer 12 to reach inside the storage layer 11. This magnetic field allows the magnetization of the storage layer 11 to be oriented easily in the direction in accordance with the magnetic field. The shift control layer 15 is designed to use the magnetic field generated by the shift control layer 15 to suppress or offset the stray magnetic field by the reference layer 13. Specifically, the magnetic field which is generated by the shift control layer 15 to reach inside the storage layer 11 and has magnetic lines of force directed opposite to that of the magnetic field by the reference layer 13 suppresses or offsets the magnetic field generated in the storage layer 11 by the reference layer 13.

The shift control layer 15 is positioned further from the storage layer 11 than the reference layer 13, and the magnitude of the magnetic field generated in the storage layer 11 by the shift control layer 15 is smaller than that generated by the reference layer 13. For this reason, the shift control layer 15 has a larger magnitude of magnetization than that of the reference layer 13 in order to generate in the storage layer 11 a magnetic field of a magnitude comparable to that generated by the reference layer 13 from the position further than the reference layer 13. More specifically, the shift control layer 15 is formed of the same or substantially the same material as that of the reference layer 13, and is thicker than the reference layer 13, for example.

The coupling layer 14 includes or is formed of a conductive material. The coupling layer 14 has the function to antiferromagnetically couple the reference layer 13 and the shift control layer 15. In other words, the reference layer 13, the coupling layer 14, and the shift control layer 15 make a synthetic antiferromagnetic (SAF) structure. The coupling layer 14 includes or is formed of Ru, Rh, and Os, for example. It is known that Ru couples two layers sandwiching Ru ferromagnetically or antiferromagnetically based on the thickness thereof. The coupling layer may further include a layer of Pt or Pd, or layers of Pt and Pd. The coupling layer 14 has a thickness to antiferromagnetically couple the reference layer 13 and the shift control layer 15, and has a thickness of, for example, 0.3 nm or more and 1.5 nm or less. The antiferromagnetic coupling is tend to be intensified when the coupling layer 14 has a thickness near about 0.5 nm and about 1.0 nm The base layer 21 serves as a base for the magnetoresistive effect element 1, and includes or is formed of a conductor. The storage layer 11 is located on the base layer 21. The cap layer 22 is located on the shift control layer 15, and includes or is formed of a conductor. The base layer 21 is located on a lower electrode 24. The lower electrode 24 is surrounded by an inter-layer insulator. The hard mask 41 includes or is formed of a conductor.

The sides of the hard mask 41 and the layers 22, 15, 14, 13, 12, 11, and 21 are covered with an insulator 31. The insulator 31 is, for example, silicon nitride, and is referred to as a side wall insulator etc. The insulator 31 has a substantially uniform thickness on the sides of the hard mask 41, the cap layer 22, and the shift control layer 15. In contrast, the insulator 31 has a smaller thickness in an upper portion along the z-axis on the sides of the coupling layer 14, the reference layer 13, the intermediate layer 12, and the storage layer 11.

The shapes of the layers 11 to 15, 21 and 22 and the hard mask 41 will now be described. The features of the shape of the reference layer 13 and the features of the shape of the shift control layer 15 fulfill the following condition 1, and fulfill the condition 2 and/or the condition 3. The features of the reference layers 13 and the shift control layer 15 involved in the description of conditions are as follows:

AST: the area of a top 15T of the shift control layer 15,
ASB: the area of a bottom 15B of the shift control layer 15,
θST: the angle between the top 15T of the shift control layer 15 and a side 15S which is in contact with the top 15T,
θSB: the angle between the bottom 15B of the shift control layer 15 and a side 15S which is in contact with the bottom 15B,
θRT: the angle between a top 13T of the reference layer 13 and a side 13S which is in contact with the top 13T,
θRB: the angle between a bottom 13B of the reference layer 13 and a side 13S which is contact with the bottom 13B.

The conditions 1 to 3 are as follows:

$$AST < ASB \quad \text{Condition 1}$$

$$\theta RT < \theta ST \quad \text{Condition 2}$$

$$\theta SB < \theta RB \quad \text{Condition 3.}$$

FIG. 1 illustrates an example with the conditions 1 to 3 fulfilled. The top 15T of the shift control layer 15 and the bottom 15B of the shift control layer 15 spread in the xy-plane concentrically, for example. With the condition 1 fulfilled, the shift control layer 15 has a smaller volume than it is in a case where it is a column, i.e., it has the top and bottom of substantially the same area. With such a feature and the thickness of the shift control layer 15 taken into consideration, the shape of the shift control layer 15, and specifically the area AST of the top and the area ASB of the bottom, is determined to allow the shift control layer 15 to suppress the magnetic field by the reference layer 13.

With the fulfillment of condition 1, the side 15S of the shift control layer 15 has an angle with respect to the z-axis. This angle is based on the shape of the shift control layer 15, and the ratio between the area AST of the top 15T and the area ASB of the bottom 15B. For example, the side 15S of the shift control layer 15 has a uniform inclination along a straight line from the top 15T to the bottom 15B of the shift control layer 15.

With the fulfillment of the condition 2 and/or the condition 3, the angle of the side 15S of the shift control layer 15 from the z-axis is larger than that of the side of the reference layer 13 from the z-axis. For example, the reference layer 13 has a substantially perpendicular side 13S, and the side 15S of the shift control layer 15 has a uniform inclination along a straight line from the top 15T to the bottom 15B of the shift control layer 15. The conditions 2 and 3 are both fulfilled in the FIG. 1 example.

Figure 2:
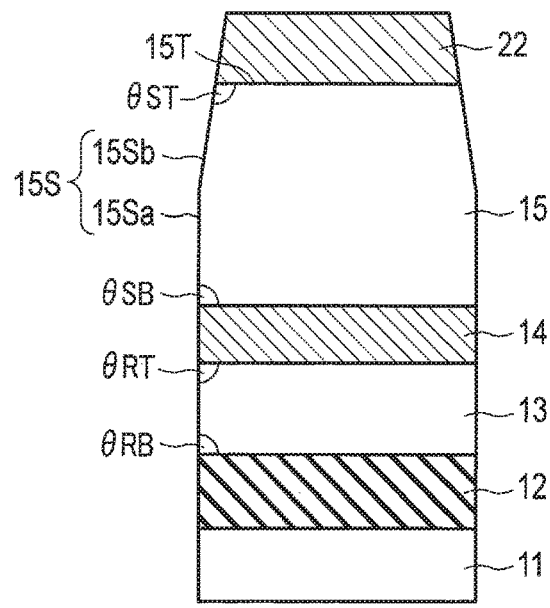
FIG. 2 illustrates a cross-section of a second example of the structure of a magnetoresistive effect element of the first embodiment.
Figure 3:
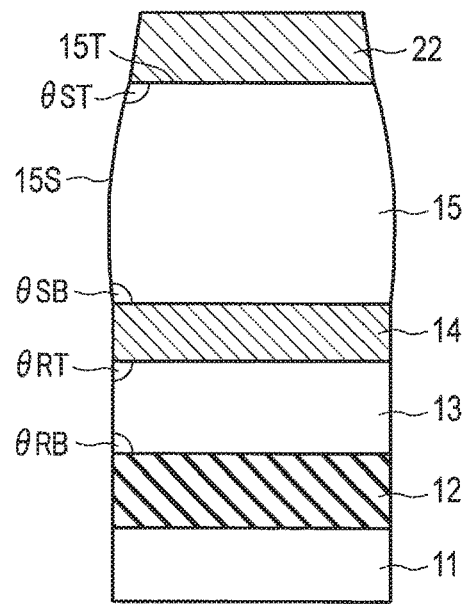
FIG. 3 illustrates a cross-section of a third example of the structure of a magnetoresistive effect element of the first embodiment.

Other examples of the shapes of the reference layer 13 and the shift control layer 15 to fulfill the condition 2 and/or the condition 3 are illustrated in FIGS. 2 and 3. Note that the insulator 31 is omitted in FIGS. 2 and 3. Each of FIGS. 2 and 3 illustrates a cross-section of an example of the structure of the magnetoresistive effect element of the first embodiment. As illustrated in FIG. 2, the side 15S of the shift control layer 15 has a lower section 15Sa and an upper section 15Sb, and the section 15Sb and the top 15T form the angle θST which fulfills the condition 2. The section 15Sa and the bottom 15B form the angle θSB, which has any given angle, and, for example, is 90°. Alternatively, as illustrated in FIG. 3, the side 15S of the shift control layer 15 is a curved surface which swells outside.

As long as the condition 1, and the condition 2 and/or the condition 3 are fulfilled, remaining storage layer 11, intermediate layers 12, coupling layers 14, base layer 21, and cap layer 22 can have any shape. In FIG. 1, the sides of the storage layer 11, the intermediate layer 12, and the coupling layer 14 extend along the side of the reference layer 13. Specifically, the sides of the storage layer 11, the intermediate layer 12, and the coupling layer 14 are substantially perpendicular as the reference layer 13. The coupling layer 14 may have a side which inclines at the same angle as that of the side of the shift control layer 15.

Figure 4:
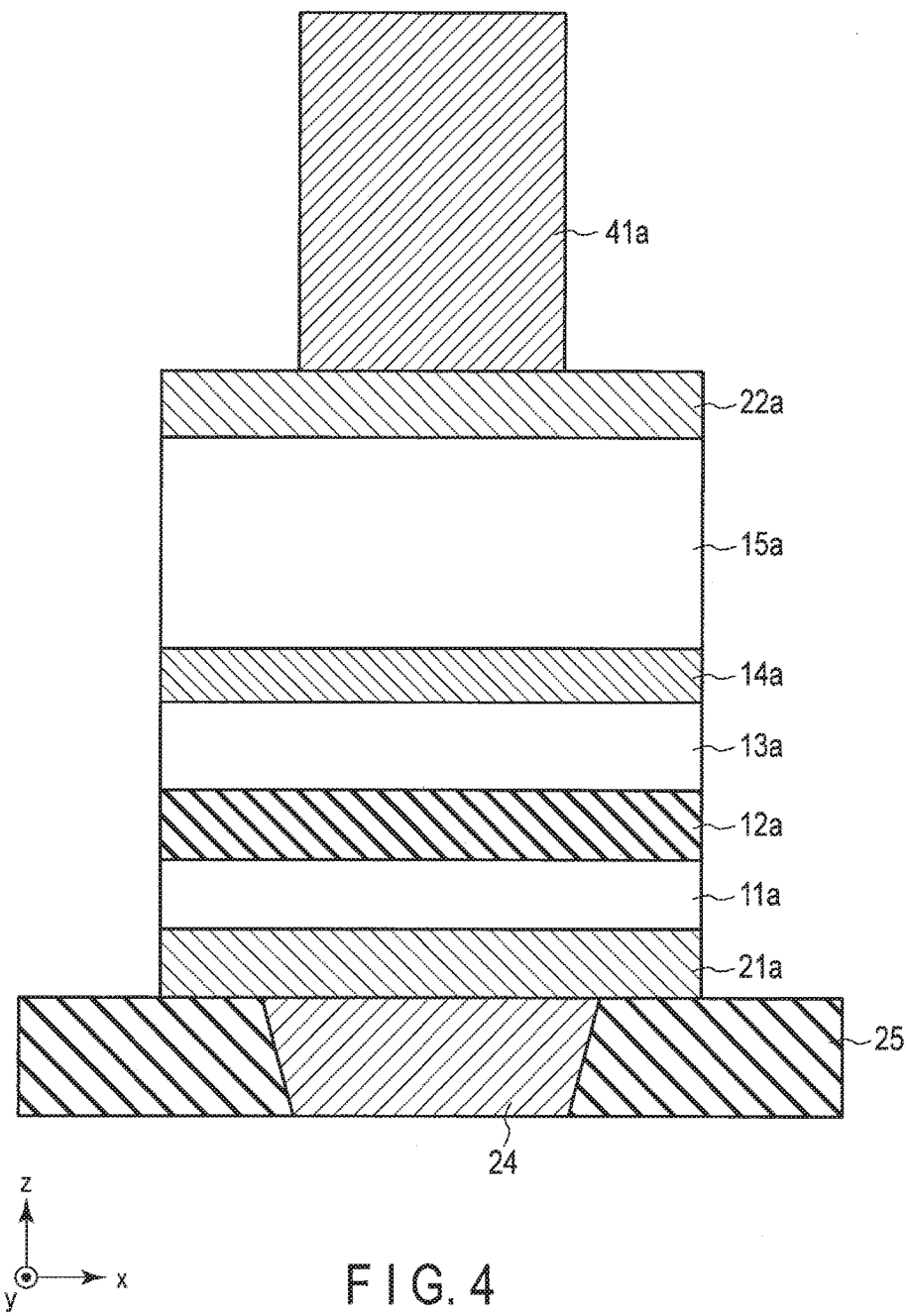
FIG. 4 illustrates one state in an example of the process of manufacturing the magnetoresistive effect element of the first embodiment.

A method of manufacturing the magnetoresistive effect element 1 of FIG. 1 will now be described with reference to FIGS. 4 to 14. As illustrated in FIG. 4, the lower electrode 24 is formed above, along the z-axis, the surface along the xy-plane of a substrate (not shown). An interlayer insulator 25 is provided around the lower electrode 24. Subsequently, the layers 21a, 11a, 12a, 13a, 14a, 15a, and 22a are sequentially deposited on the tops of the lower electrode 24 and the insulator 25. The layers 21a, 11a, 12a, 13a, 14a, 15a, and 22a are layers which will be processed into the layers 21, 11, 12, 13, 14, 15, and 22 by etching in subsequent processes, respectively. The layers 21a, 11a, 12a, 13a, 14a, 15a, and 22a are deposited by, for example, chemical vapor deposition (CVD) and/or atomic layer deposition (ALD).

A hard mask 41a is formed on the layer 22a. The hard mask 41a will be processed into the hard mask 41 in subsequent processes. The hard mask 41a has plural patterns (or, remaining portions) along the xy-plane, and has openings in portions other than the patterns. A pattern of the hard mask 41a has a shape along the xy-plane (or, plane shape) corresponding to (or, for example, substantially the same as) the plane shapes of the reference layer 13, the intermediate layer 12, and the storage layer 11. Such formation of the hard mask 41a involves, for example, formation of a layer 41b (not shown) which will be the hard mask 41a, formation of a resist (not shown) on the layer 41b, formation of patterns through a photolithography process on the resist, and etching of the layer 41b with the resist with the patterns used as a mask.

Figure 5:
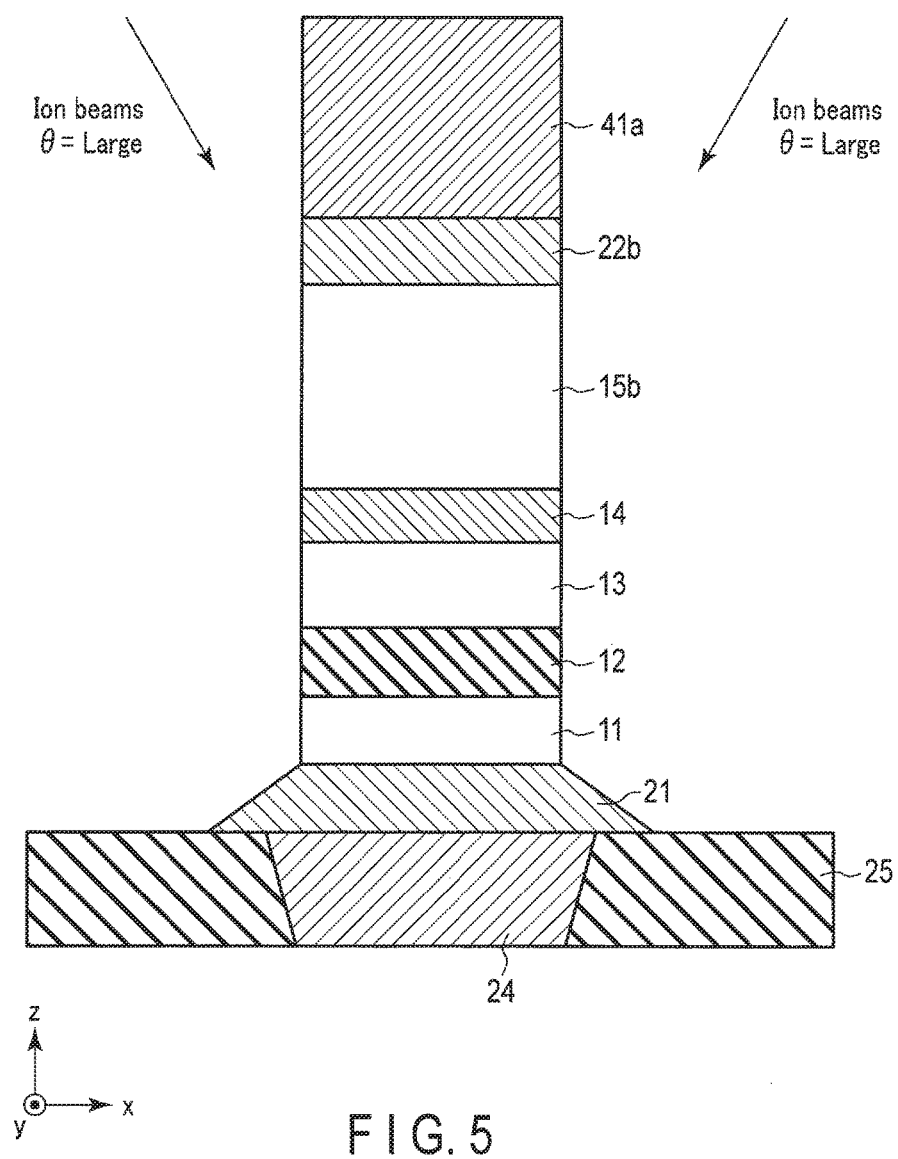
FIG. 5 illustrates the state subsequent to FIG. 4.

As illustrated in FIG. 5, the layers 22a, 15a, 14a, 13a, 12a, 11a, and 21a are etched by ion beam etching (IBE) with the hard mask 41a. The ion beams used in the IBE can be adjusted as is known. In the FIG. 5 step, the ion beams have a relatively large angle θ with respect to the z-axis, and inclines, for example, 30° to 60° from the z-axis. The etching of such conditions progresses while the plane shape of the hard mask 41a is being transferred to the layers 22a, 15a, 14a, 13a, 12a, and 11a. Therefore, the etching forms the coupling layer 14, the reference layer 13, the intermediate layer 12, and the storage layer 11. Moreover, the etching processes the layer 21a into the base layer 21. The FIG. 5 etching is optimized to obtain the coupling layer 14, the reference layer 13, the intermediate layer 12, and the storage layer 11. In particular, the etching of the FIG. 5 step is performed to allow at least the reference layer 13 to have the features illustrated in FIG. 1 and described in connection with FIG. 1, or the condition 2 and/or the condition 3 to be fulfilled. The etching in FIG. 5 may include plural etchings of different conditions, for example.

The FIG. 5 etching is continued until the plane shape of the hard mask 41a is transferred to the layers 22a, 15a, 14a, 13a, 12a, and 11a. The control to stop the IBE can be performed using, for example, an end point detecting (EPD) system which uses secondary ion mass spectroscopy (SIMS) or optical emission spectroscopy (OES).

In contrast, the FIG. 5 etching does not need to process the layers 22a and 15a into the cap layer 22 and the shift cancel layer 15 which have the shapes with the features illustrated in FIG. 1 and described in connection with FIG. 1. This is because the layers 22b and 15b will be processed further into the cap layer 22 and the reference layer 15 in a subsequent step. The FIG. 5 etching processes the layers 22a and 15a into the layers 22b and 15b. The layers 22b and 15b have the plane shapes based on the plane shape of the hard mask 41a. FIG. 5 illustrates an example where the layers 22b and 15b have the same plane shapes as the plane shapes of the storage layer 11, the intermediate layer 12, and the reference layer 13. The FIG. 5 etching lowers the position of the top of the hard mask 41a.

Figure 6:
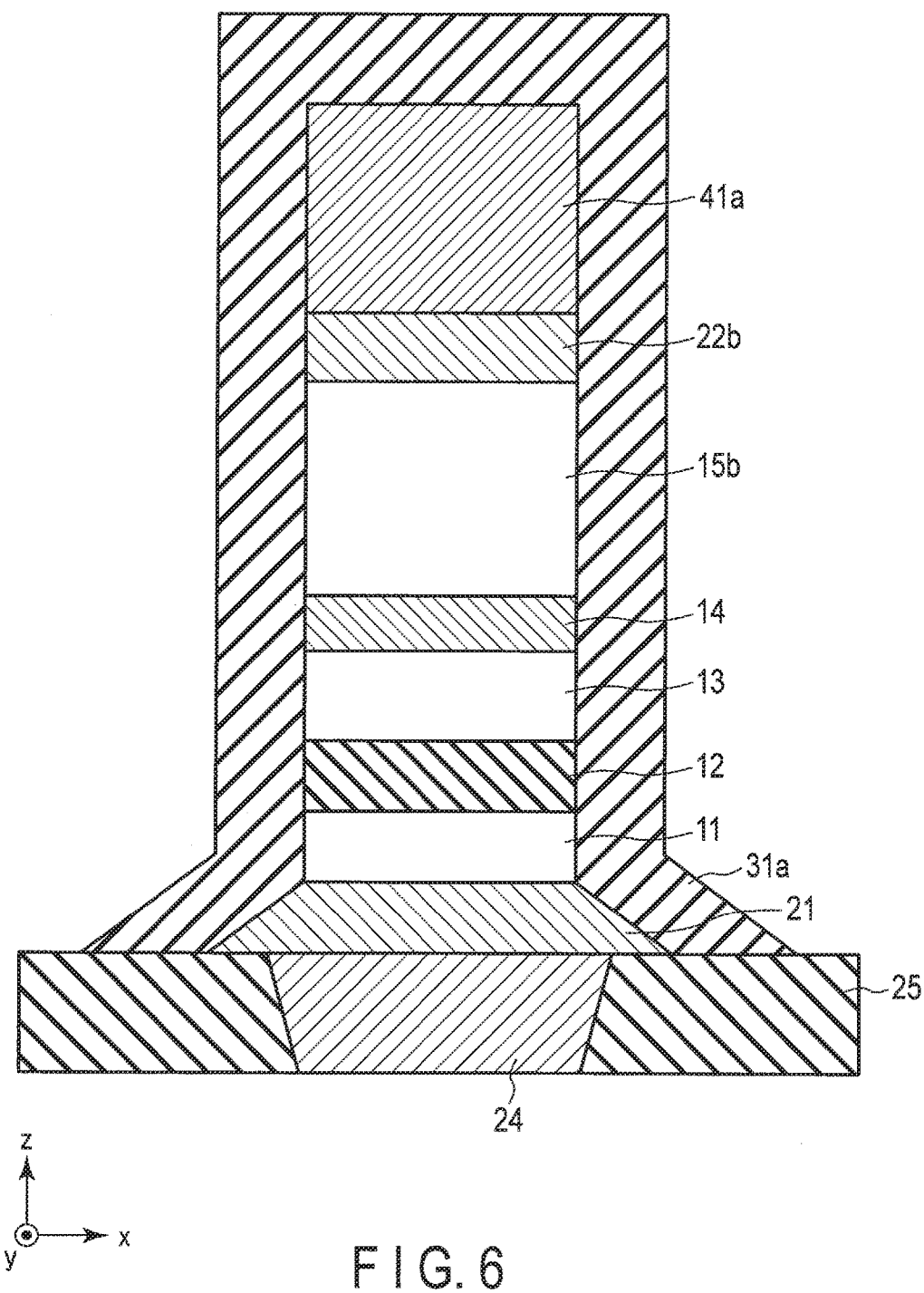
FIG. 6 illustrates the state subsequent to FIG. 5.

As illustrated in FIG. 6, the structure obtained by the processes so far is covered with a layer 31a. The layer 31a is a layer which will be processed into a part of the layer 31 by etching in a subsequent process. The layer 31a is deposited by, for example, CVD, and has a substantially uniform thickness. The deposition of the layer 31a covers the top of the hard mask 41a and the sides of the layers 22b, 15b, 14, 13, 13, 12, 11, and 21 with the layer 31a.

Figure 7:
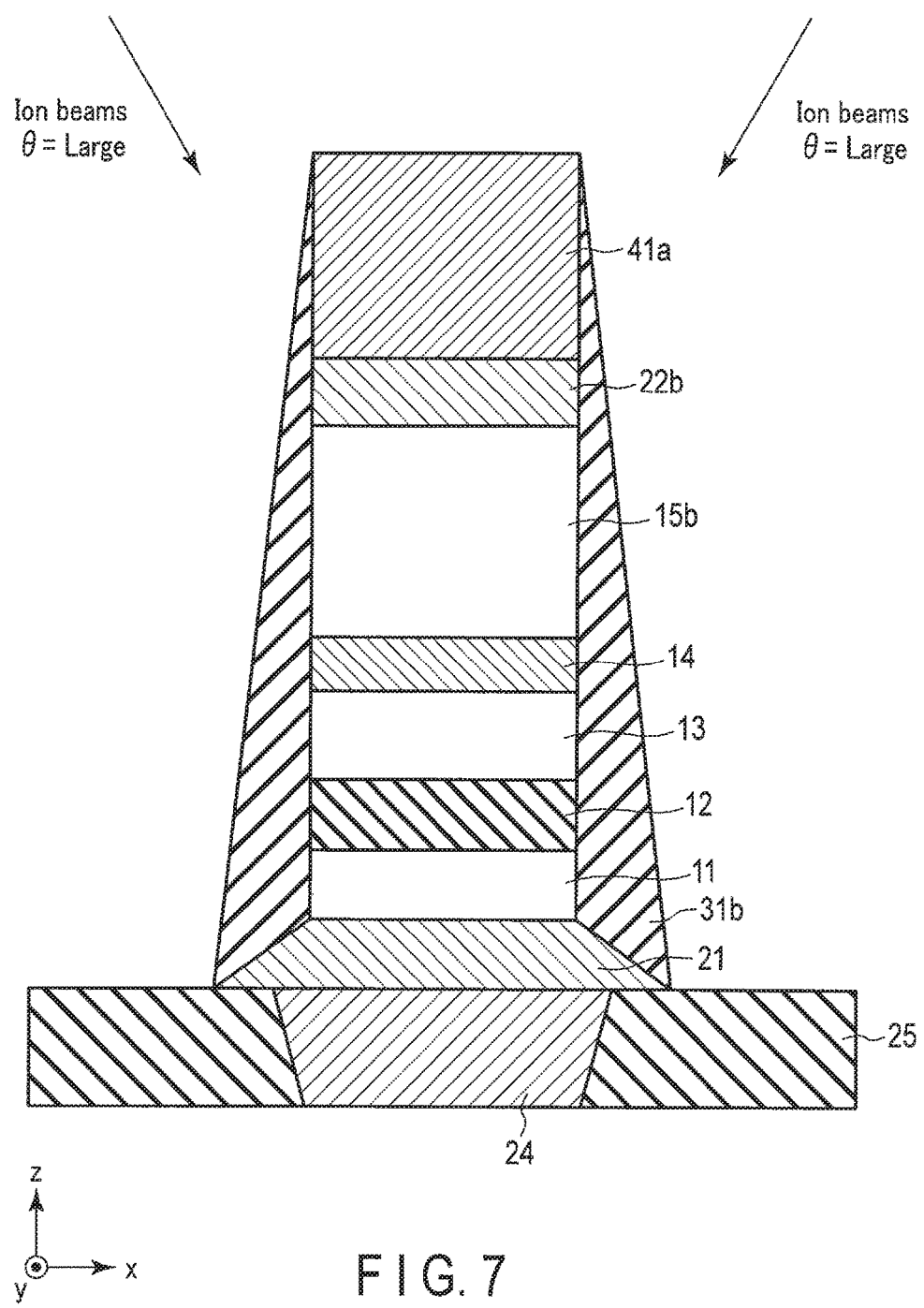
FIG. 7 illustrates the state subsequent to FIG. 6.

As illustrated in FIG. 7, a part of the layer 31a is removed by IBE. In the FIG. 7 step, the ion beams have a relatively large angle with respect to the z-axis, and incline, for example, 30° to 60° from the z-axis. The IBE in such conditions processes the layer 31a into the layer 31b. Specifically, the section of the layer 31a on the top of the hard mask 41a is removed. Moreover, the layer 31b has inclination on sides of the hard mask 41a and the layers 22b, 15b, 14, 13, 12, 11, and 21. The layer 31b is thinner in a higher position along the z-axis.

Figure 8:
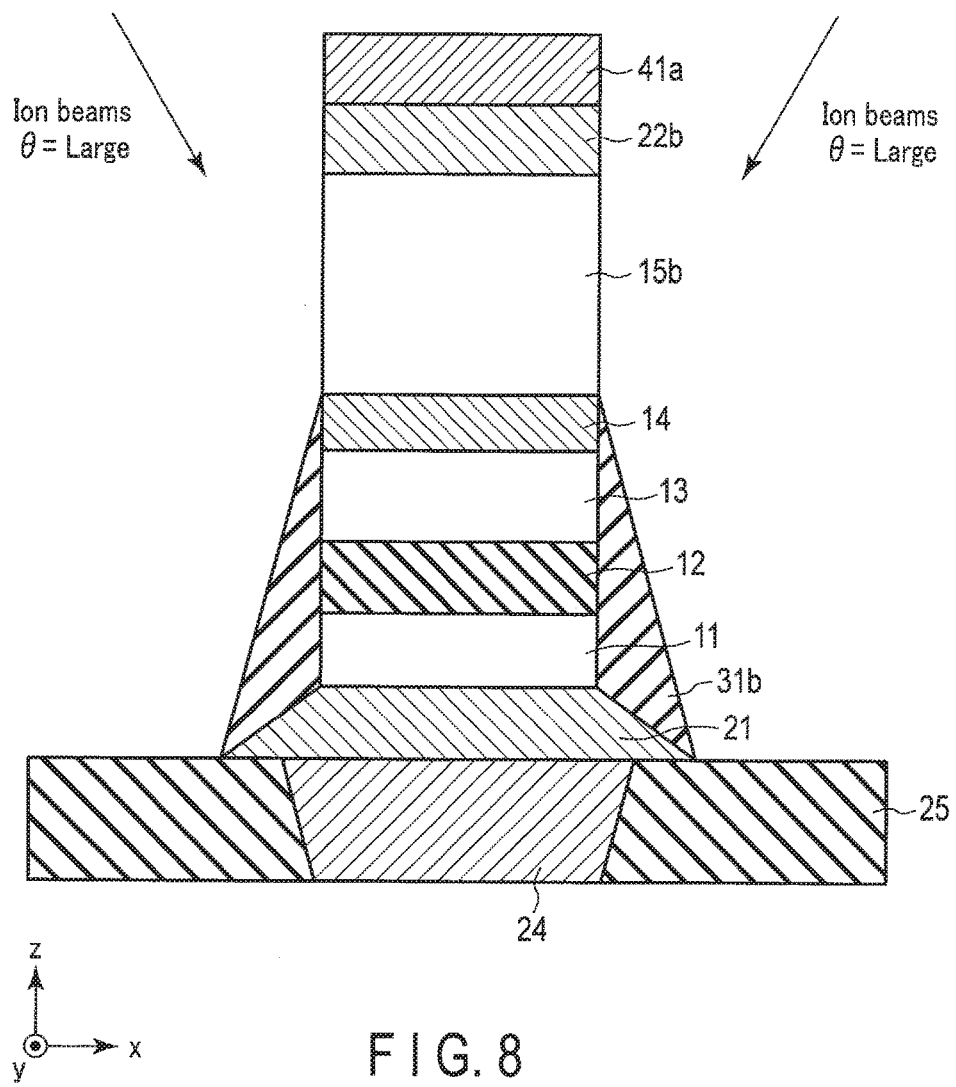
FIG. 8 illustrates the state subsequent to FIG. 7.

As illustrated in FIG. 8, IBE with the inclination 8 of 30° to 60° of FIG. 7 is continued. This IBE reduces the whole layer 31b in size while maintaining the shape. The IBE is continued until the section of the layers 31b on the sides of the layers 22b and 15b is removed. As a result, the sides of the layers 22b and 15b are exposed. Moreover, the continuation of the IBE after the top of the hard mask 41a is exposed lowers the position of the top of the hard mask 41a.

As illustrated in FIG. 9, IBE is performed with ion beams traveling at a relatively small angle, such as 0° to 30°, with respect to the z-axis. The IBE in such conditions partially remove the sides of the hard mask 41a and the layer 22b and 15b to make an inclination. The inclination has an angle to allow the angle θSB and/or the angle θST which satisfy the condition 2 and/or the condition 3. The angle of the ion beams in the IBE is selected to make such an inclination. The FIG. 9 IBE processes the hard mask 41a, and the layers 22a and 15a to form the hard mask 41, the cap layer 22, and the shift control layer 15.

The FIG. 9 step can also be performed by reactive ion etching (RIE), although in the RIE case the angle of ion beams cannot be adjusted unlike the IBE and does not have an inclination to the z-axis, or the trajectories of ion beams are parallel to the z-axis.

As illustrated in FIG. 1, the structure obtained by the processes so far is covered with a material for the layer 31. As a result, the insulator 31 is formed.

In order to obtain the shift control layer 15 with the shape illustrated in FIG. 2, the IBE in FIGS. 8 and 9 is continued until the side 15Sb of the shift control layer 15 is exposed.

Figure 10:
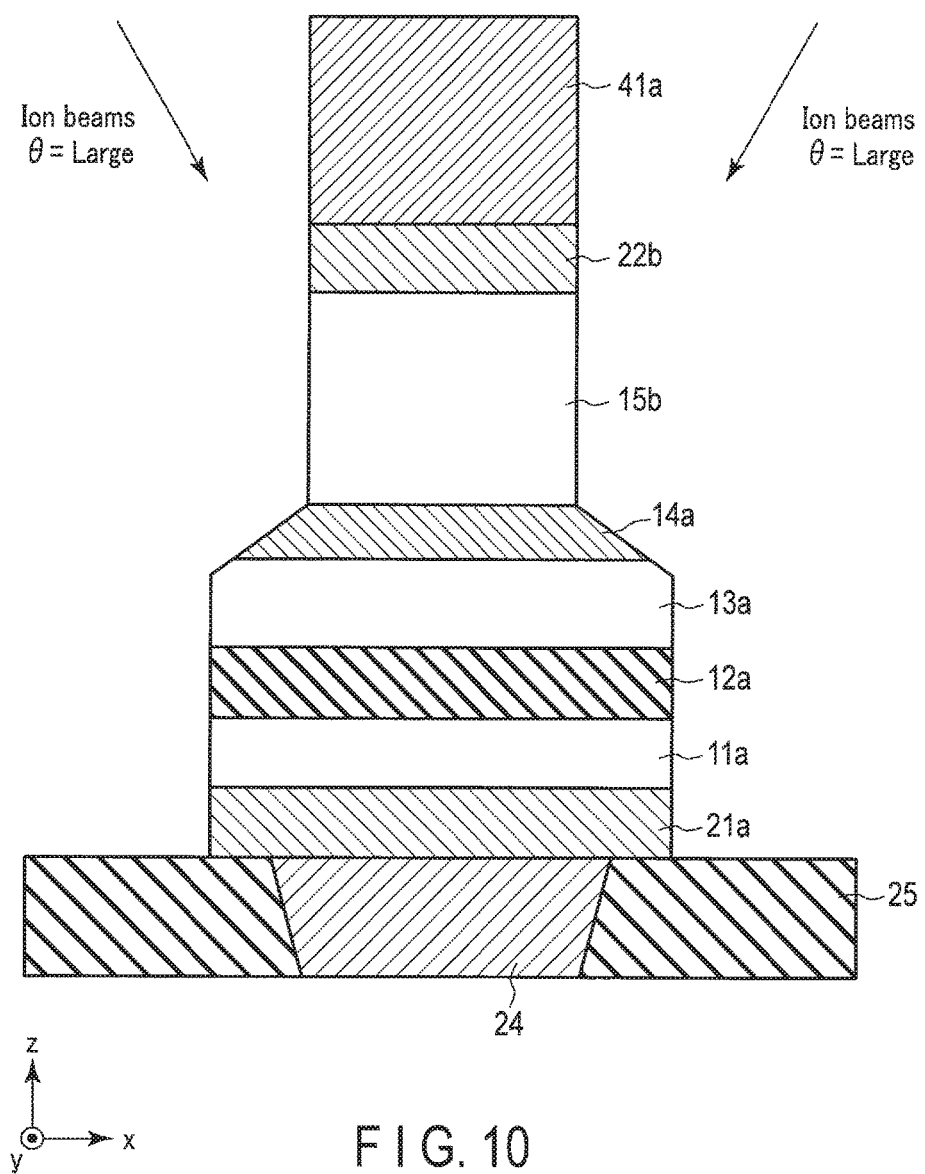
FIG. 10 illustrates the state subsequent to FIG. 4.

The magnetoresistive effect element 1 of FIG. 1 can also be formed by the set of steps including the steps of FIGS. 10 to 14. The FIG. 10 step succeeds the FIG. 4 step, and is similar to the FIG. 5 step. As illustrated in FIG. 10, IBE is performed as in FIG. 5. The ion beams in the IBE incline by 30° to 60° from the z-axis. This IBE transfers the plane shape of the hard mask 41a to the layers 22a and 15a to form the layers 22b and 15b. The layers 22b and 15b have substantially the same plane shape as the plane shape of the hard mask 41a. The FIG. 10 IBE step is stopped when the layers 22b and 15b are obtained.

Figure 11:
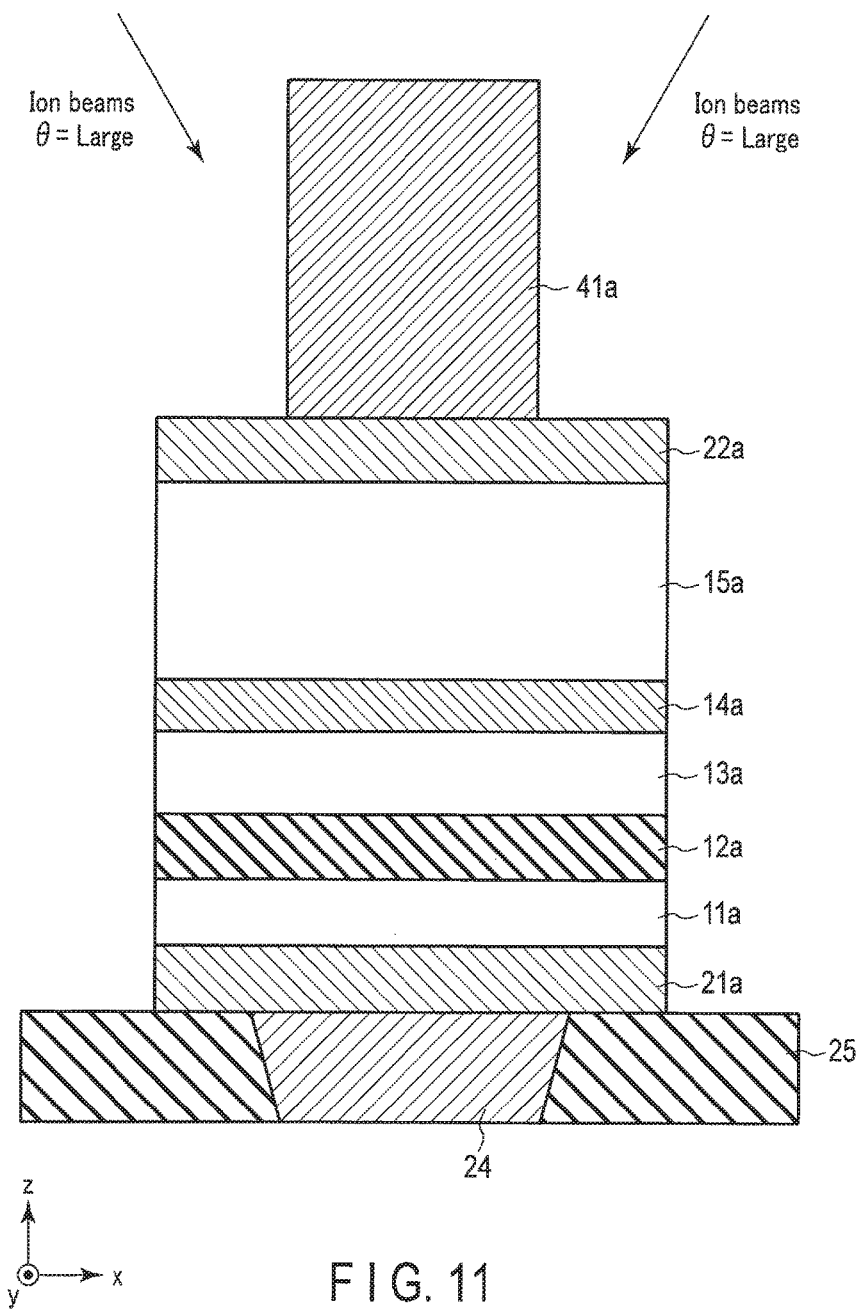
FIG. 11 illustrates the state subsequent to FIG. 4.
Figure 12:
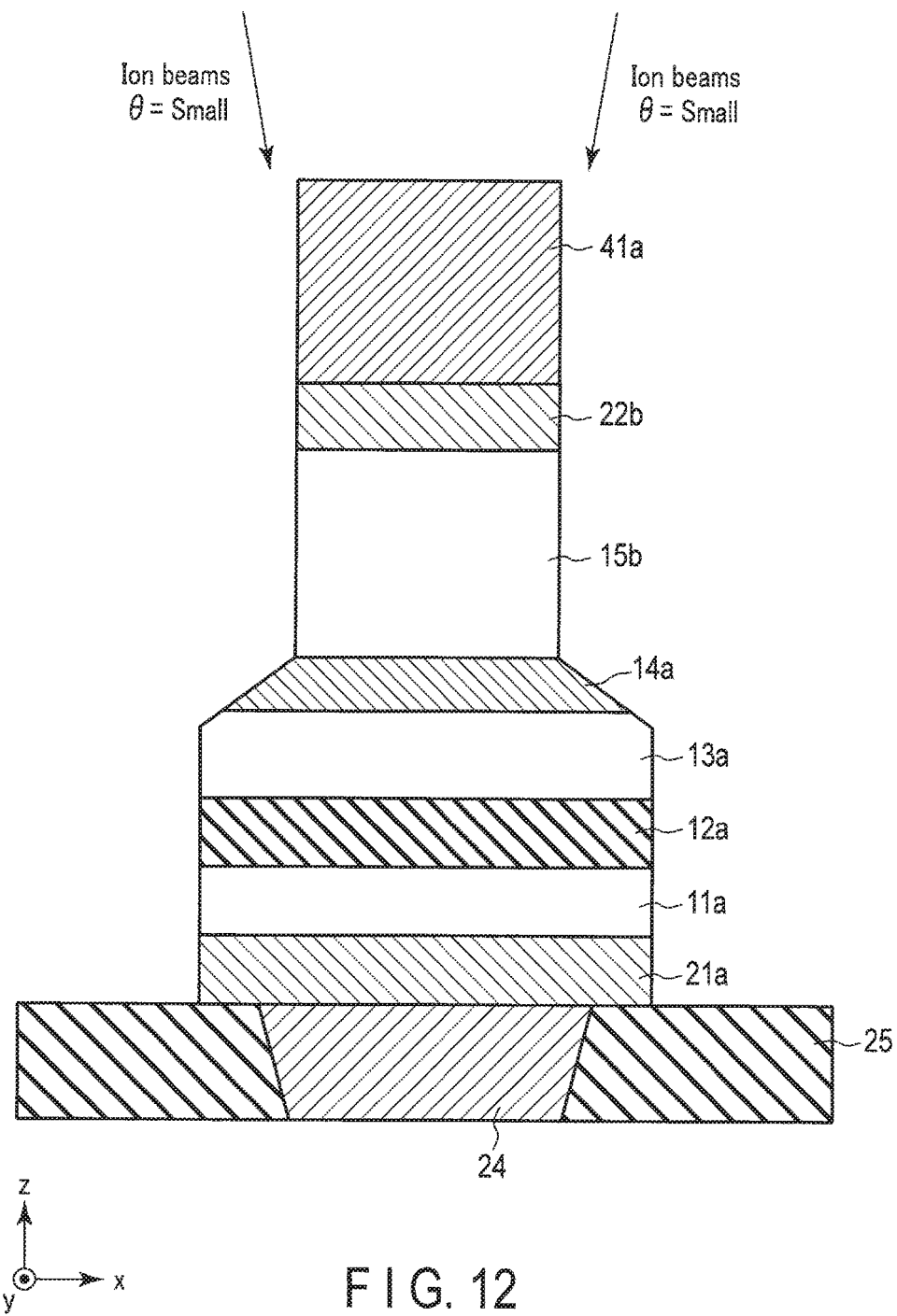
FIG. 12 illustrates the state subsequent to FIG. 11.

Moreover, the structure illustrated in FIG. 10 can be obtained by the set of the IBE with ion beams inclined from the z-axis by 30° to 60° such as one illustrated in FIG. 11 subsequent to FIG. 4 and the IBE with ion beams inclined from the z-axis by 0° to 30° such as one illustrated in FIG. 12. For example, the IBE with ion beams of 30° to 60° is performed until the layers 22b, 15b, and 14a, and a part of the layer 13a are formed. With the following ion beams of 0° to 30°, the layer 13a and layers below are etched. During this, the material etched off the layer 13a and layers below piles back on the side walls of the layers 22b, 15b, and 14a. As a result, the structure of FIG. 10 is obtained.

Figure 13:
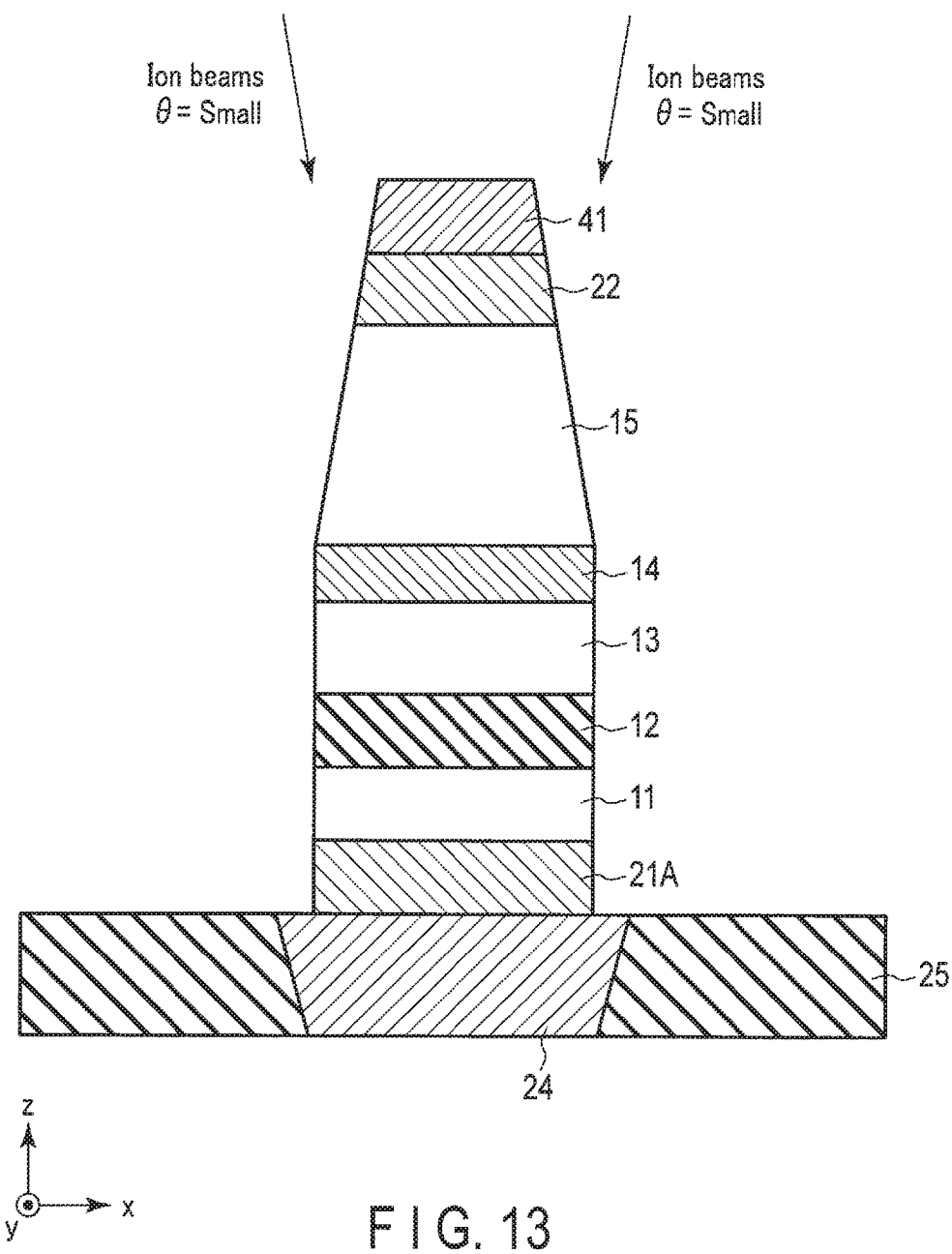
FIG. 13 illustrates the state subsequent to FIG. 10.

As illustrated in FIG. 13, IBE is performed. The ion beams in the IBE incline by 0° to 30° from the z-axis. This IBE partially removes the sides of the hard mask 41a, and the layer 22b and 15b to make an inclination. The inclination has an angle to allow the angle θSB and/or the angle θST which fulfill the condition 2 and/or the condition 3. The angle of the ion beams in the IBE is selected to make such an inclination. The etching of the hard mask 41a and the cap layers 22b and 15b forms the hard mask 41, the cap layer 22, and the shift control layer 15.

Furthermore, the IBE removes the sections of the plane shape of the layers 14a, 13a, 12a, 11a, and 21a outside the bottom of the shift control layer 15. As a result, the coupling layer 14, the reference layer 13, the intermediate layer 12, the storage layer 11, and the base layer 21A are obtained. In the structure obtained by the steps including FIGS. 10 and 13, the base layer 21A has substantially the same plane shape as the plane shaped of the coupling layer 14, the reference layer 13, the intermediate layer 12, and the storage layer 11.

Figure 14:
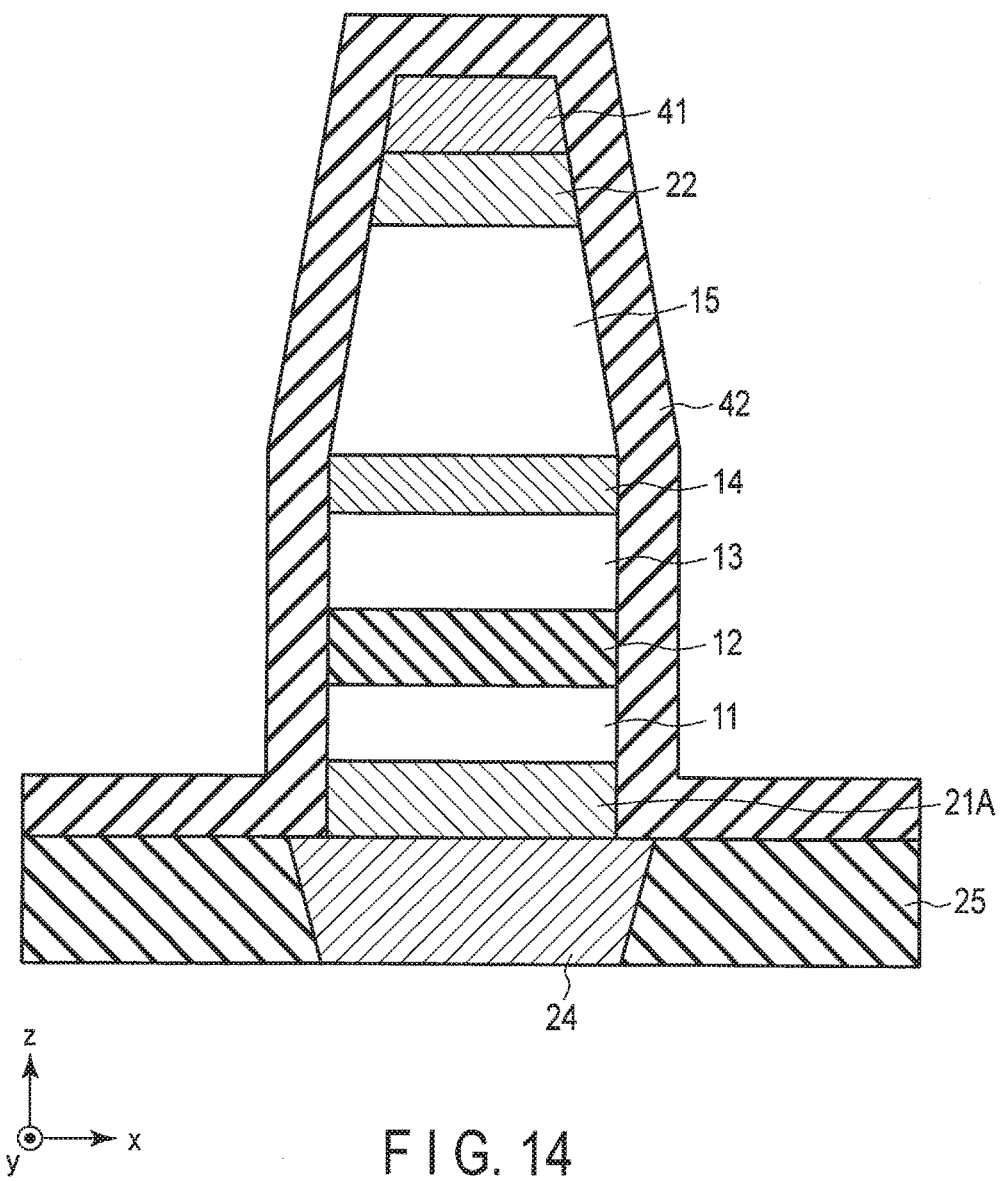
FIG. 14 illustrates the state subsequent to FIG. 13.

As illustrated in FIG. 14, the structure obtained by the processes so far is covered with an insulator 42. The insulator 42 corresponds to the insulator 31 in the FIG. 1 structure. The insulator 42 has a substantially uniform thickness; however it may not be so in actuality Advantages A SAF including two magnetic layers with different coercivities like the magnetoresistive effect element 1 has, in a magnetic field of a particular magnitude, magnetization of a corresponding state. With the magnitude of the magnetic field containing the SAF increased and decreased, the magnetization exhibits the hysteresis loop with the change in the direction as illustrated by the arrows illustrated in FIG. 15. The vertical axis of FIG. 15 indicates the magnetization of the SAF, and the horizontal axis indicates the magnitude of the magnetic field containing the SAF. The positive magnetic field is the magnetic field along the direction from the magnetic layer with the smaller coercivity to the magnetic layer with the larger coercivity, and the negative magnetic field is the magnetic field along the direction from the magnetic layer with the larger coercivity to the magnetic layer with the smaller coercivity. When a reference layer and a shift control layer of a magnetoresistive effect element make a SAF, the magnetic layer with the smaller coercivity corresponds to the reference layer, such as the reference layer 13, and the magnetic layer with the larger coercivity corresponds to the shift control layer, such as the shift control layer 15. The SAF will be described in the following when applied to the reference layer and the shift control layer. The hysteresis loop of the reference layer 13 and the shift control layer 15 is the same as that in FIG. 15.

Due to the difference in the coercivity, the magnetization orientation of the reference layer (illustrated by the white arrows) is easier to flip to a particular magnetic field than the magnetization orientation of the shift control layer (illustrated by the shaded arrows). The hysteresis loop in FIG. 15 corresponds to the combination of the hysteresis loop for only the reference layer and that for only the shift control layer.

Figure 15:
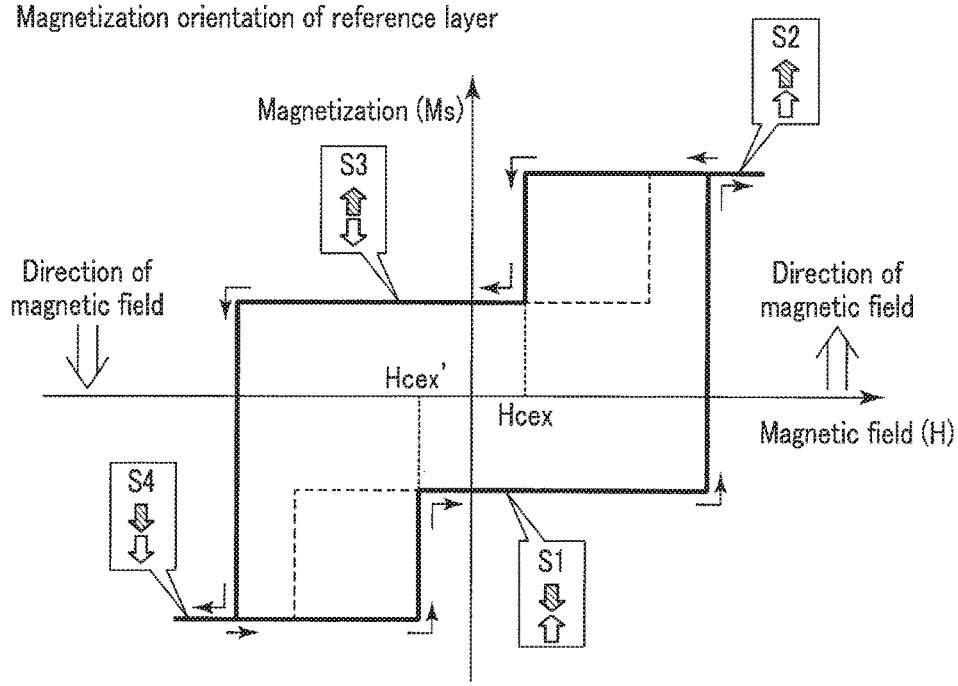
FIG. 15 illustrates the relationship between magnetization and a magnetic field of a SAF after patterning.

FIG. 15 illustrates a case for a SAF whose magnetization orientations of the reference layer and the shift control layer are anti-parallel with no magnetic field as intended. The states of anti-parallel with no magnetic field include two cases. One is the state where the magnetization of the reference layer is oriented upward and that of the shift control layer is oriented downward (state S1), and the other is the state where the magnetization orientations of the two layers are reverse (state S3). With an increase of the magnitude of the magnetic field of the positive direction, the SAF in the state S1 has the magnetization orientation of the shift control layer flipped to face upward to enter the state S2. With the magnitude of the magnetic field containing the SAF which once enters the state S2 getting nearer to zero, the magnetization of the shift control layer comes to orient upward at a magnetic field of a particular magnitude Hcex to bring the SAF into the state S3. The state S3 is maintained even with no magnetic field.

With an increase of the magnitude of the magnetic field of the negative direction, the SAF in the state S3 has the magnetization orientation of the shift control layer flipped to face downward to enter the state S4. With the magnitude of the magnetic field containing the SAF which once enters the state S4 getting nearer to zero, the magnetization of the reference layer comes to orient downward at a magnetic field of a particular magnitude Hcex' to bring the SAF into the state S1. The state S1 is maintained even with no magnetic field.

In the SAF used for magnetoresistive effect elements, the magnetization orientations of the reference layer and the shift control layer are required to be anti-parallel with no magnetic field. This is because the shift control layer is intended to cancel the magnetic field caused by the reference layer, and required to be able to perform such a function with no magnetic field. In other words, the magnetic field Hcex needs to be positive and the magnetic field Hcex' needs to be negative. Since the hysteresis loop has point symmetry as is known, when the magnetic field Hcex is positive, the magnetic field Hcex' is negative by nature, and, therefore, only one magnetic field Hcex is considered in the following description.

It is preferable that all magnetoresistive effect elements in a memory device exhibit a positive magnetic field Hcex. Incidentally, when all magnetoresistive effect elements exhibit a positive magnetic field Hcex, they exhibit a negative magnetic field Hcex'. In general, plural magnetoresistive effect elements have different properties due to various factors. For this reason, a small target magnetic field Hcex may result in many magnetoresistive effect elements exhibiting a negative magnetic field Hcex. Therefore, for a target magnetic field Hcex of a large magnitude, the SAF needs to have a structure and properties to exhibit a larger magnetic field Hcex.

Figure 16:
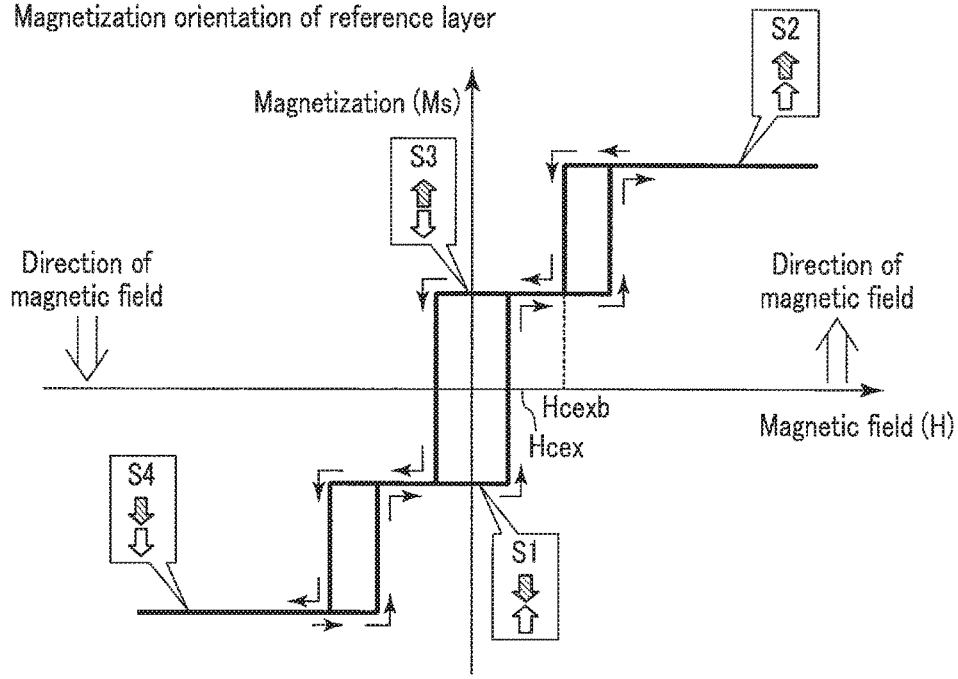
FIG. 16 illustrates the relationship between magnetization and a magnetic field of a SAF before patterning.
Figure 17:
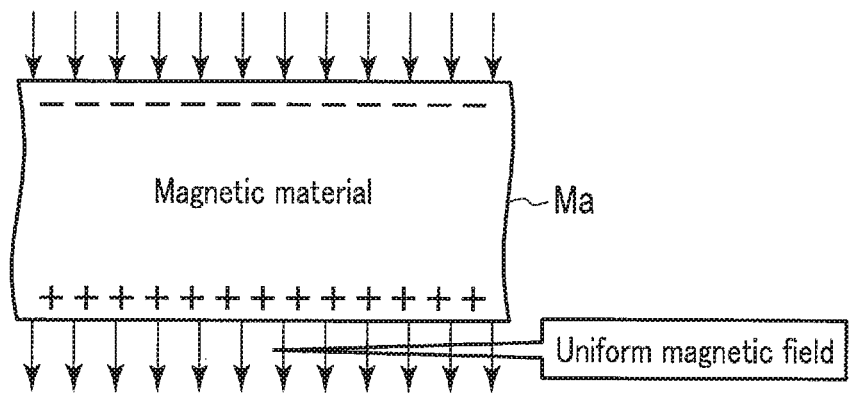
FIG. 17 illustrates the magnetic field generated by a magnetic material with an infinite area.
Figure 18:
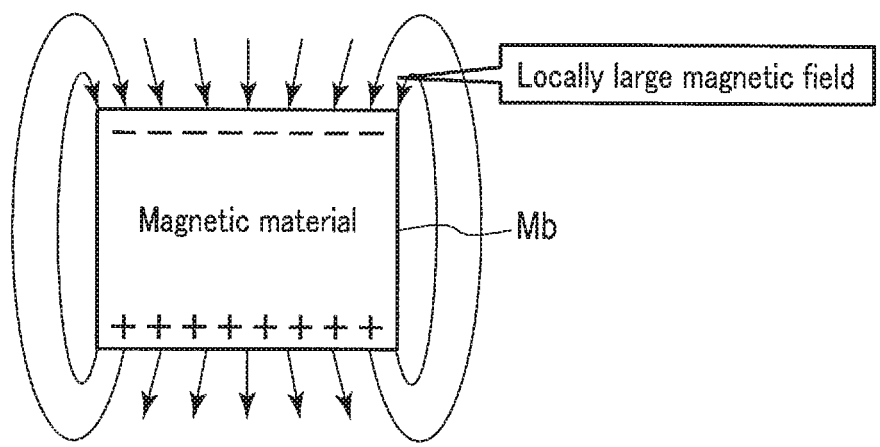
FIG. 18 illustrates the magnetic field generated by a magnetic material with a finite area.

The hysteresis loop of the SAF illustrated in FIG. 15 is based on the SAF with the patterned plane shape. In contrast, a SAF before being patterned has the plane shape of a very large area, and exhibits the hysteresis loop illustrated in FIG. 16. As illustrated in FIG. 16, the magnetic field Hcexb which makes the magnetization orientations of the reference layer and the shift control layer anti-parallel from parallel has a positive large value. The magnetic field Hcexb, however, falls to Hcex due to the patterning. This is because the patterned SAF has a small plane area, and, therefore, it is influenced by its own magnetic field at its edges, as illustrated in FIGS. 17 and 18. FIGS. 17 and 18 respectively illustrate the magnetic fields generally generated by a magnetic material of a finite area and an effectively infinite area, and respectively illustrate the magnetic fields before and after patterning.

In general, a magnetic material stabilizes to form no magnetization charge at its surface, and to this end tries to equalize the magnetization charge as much as possible. For this reason, as illustrated in FIG. 17, in a magnetic material Ma which extends substantially infinitely and has no edges, the magnetization charge of S (−) and N (+) is uniformly distributed on the top and bottom, respectively. Moreover, the respective quantities of the magnetization charge in the top and bottom are equal. This state is stable in terms of energy, and in this state magnetic lines of force (or, stray magnetic field) are perpendicular to a plane along which the magnetic material spreads and are distributed uniformly.

In contrast, in the magnetic material with edges due to patterning, the magnetic lines of force (illustrated by the arrows) are distributed differently from FIG. 17, and are distributed as in FIG. 18, for example. The existence of edges causes the magnetic material Mb in FIG. 18 to try to stabilize by directing the magnetic lines of force back to itself instead of directing them away from its bottom. Moreover, the magnetic field enters back into the magnetic material Mb at the edges of the top, which results in a larger magnetic flux density near those areas than that at other areas. In other words, the magnetic field at the edges is larger than that in other areas. With such a mechanism, the influence of magnetization charge at the edges is greater than that in other areas. Note that in the FIG. 18 case the top and bottom have substantially the same area, and, therefore, the quantities of magnetization charge in top and bottom are equal.

Such a general feature of magnetic materials also applies to the shift control layer 15. Specifically, the stray magnetic field from the shift control layer 15, which is patterned, is large in the areas of edges. Such increase in the stray field from the patterned shift control layer 15 from before patterning decreases the magnetic field Hcexb to the magnetic field Hcex as is described above and illustrated in FIG. 16.

The smaller the stray magnetic field from the shift control layer 15, the larger the magnetic field Hcexb. For this reason, a smaller magnetic field from the shift control layer 15 can be realized by a shift control layer 15 of a smaller volume. However, a reduced volume of the shift control layer 15 for a higher magnetic field Hcexb may cause the shift control layer 15 to fail to cancel the magnetic field in the storage layer 11 generated by the reference layer 13. This inhibits the shift control layer 15 from having a smaller volume only for a higher magnetic field Hcexb.

Figure 19:
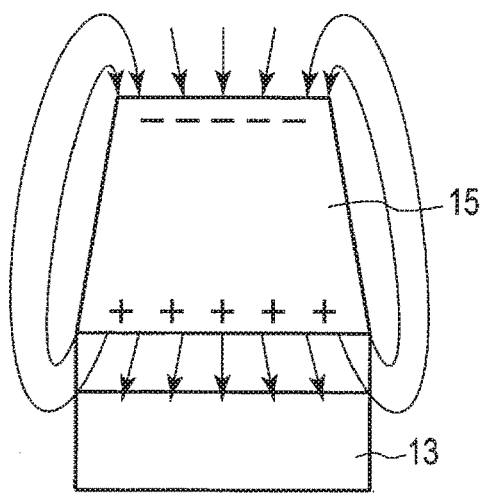
FIG. 19 illustrates the magnetic field generated by a shift control layer of the first embodiment.

According to the first embodiment, the shift control layer 15 has a shape which fulfills the condition 1. Lines of magnetic force going in and coming out from the shift control layer 15 of such a shape are distributed as illustrated in FIG. 19. Specifically, based on the general properties of magnetic materials as described above, the magnetization charge stabilizes to appear at the sides of the shift control layer 15 as little as possible and at the top and bottom with the same quantity. Therefore, the magnetic flux density is smaller at the top, which has a smaller area, and larger at the bottom, which has a larger area. Since the top and bottom of different areas have the magnetization charge of the same quantity, the magnetic lines of force which come out from the bottom of the reference layer 13 and enter the top of the reference layer 13 incline from those in FIG. 18. As a result, the magnetic field originating from the bottom, which may reach the reference layer 13 to influence the magnetic field Hcexb of the reference layer 13, is smaller than that in FIG. 18. For this reason, some of the magnetic lines of force originating from the edges of the bottom do not reach the reference layer 13. How easily the magnetization orientation of the reference layer 13 flips is influenced by the magnetic field containing the reference layer 13, i.e., the magnetic field generated by the shift control layer 15. For this reason, relief of the influence of the magnetic field of the shift control layer 15 results in a smaller magnetic field generated in the reference layer 13 by the shift control layer 15 than that in FIG. 18. The magnetic field which flips the magnetization orientation of the reference layer 13 influences the magnitude of the magnetic field Hcex, which leads to a magnetic field Hcex reduced from that in FIG. 18. Therefore, the magnetization orientations of the reference layer 13 and the shift control layer 15 stabilize to be anti-parallel more easily.

Figure 20:
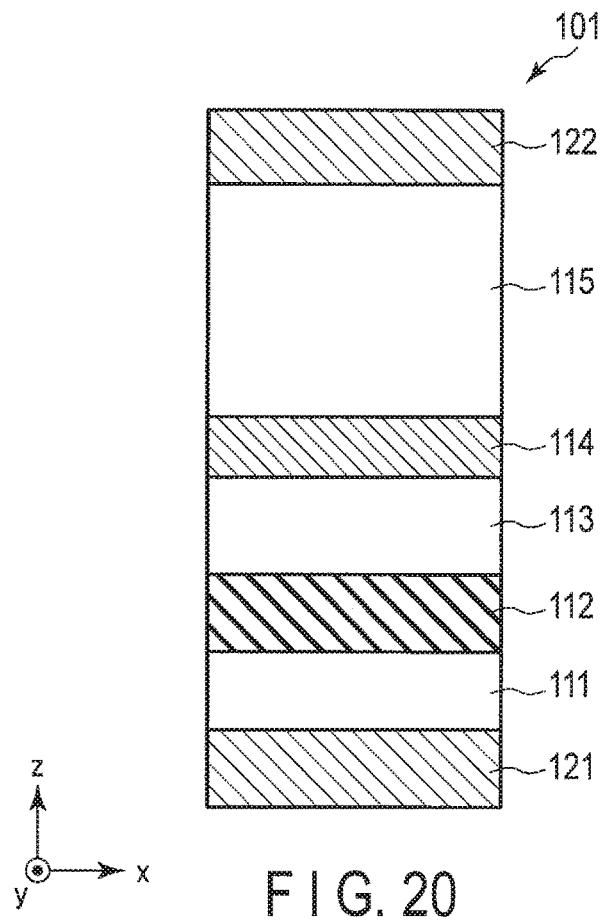
FIG. 20 illustrates an ideal and/or theoretical stack of layers.

Note that the shape of a stack of layers 101 with a high aspect ratio and perpendicular side as illustrated in FIG. 20 is an ideal and/or theoretical one, and in actuality the side has an inclination as illustrated in FIG. 21, as known by a person skilled in the art. Layers 122, 115, 114, 113, 112, 111, and 121 in FIG. 20 correspond to the layers 22, 15, 14, 13, 12, 11, and 21 in, for example, FIG. 1, respectively. The inclined side of the stack of layers 101 as in FIG. 21 allows the shift control layer 115 to fulfill the condition 1. The reference layer 113, however, also has an inclination at the side, which results in a larger bottom area of the reference layer 113, and by extension a volume of the reference layer 113 larger than that in the shape in FIG. 20. The larger the volume of the reference layer 113, the larger the coercivity of the reference layer 113, and, therefore, the larger the magnetic field Hcexb. This is because the hysteresis loop in FIG. 15 is the combination of the sole hysteresis loop of each of the reference layer 113 and the shift control layer 115, and the shape of the hysteresis loop of the reference layer 113 is based on the coercivity of the reference layer 113, as described above.

According to the first embodiment, the reference layer 13 fulfills the condition 2 and/or the condition 3. Such fulfillment of conditions results in a smaller angle of inclination of the side of the reference layer 13 than that of the shift control layer 15. As a result, the shape of the reference layer 13 is more similar to that of the reference layer 113 in FIG. 20 than that of the reference layer 113 in FIG. 21, and therefore, when assumed that the thicknesses of the reference layer 13 and the reference layer 113 are the same, the volume of the reference layer 13 is smaller than that of the reference layer 113. Therefore, the magnetic field Hcexb is smaller than that in the case where the shape of the reference layer 13 is the shape of the reference layer 113.

Thus, the fulfillment of the condition 1 and the condition 2 and/or the condition 3 can realize a high magnetic field Hcexb, at least a magnetic field Hcexb higher than that in FIG. 21.

As described above, the shape of the stack of layers 101 in FIG. 20 is an ideal shape, and etching all layers in the stack 101 together results in the shape as in FIG. 21. For this reason, mere etching as in FIG. 21 does not lead to the shape in FIG. 1.

Second Embodiment

The second embodiment also relates to the shape of a magnetoresistive effect element.

Figure 22:
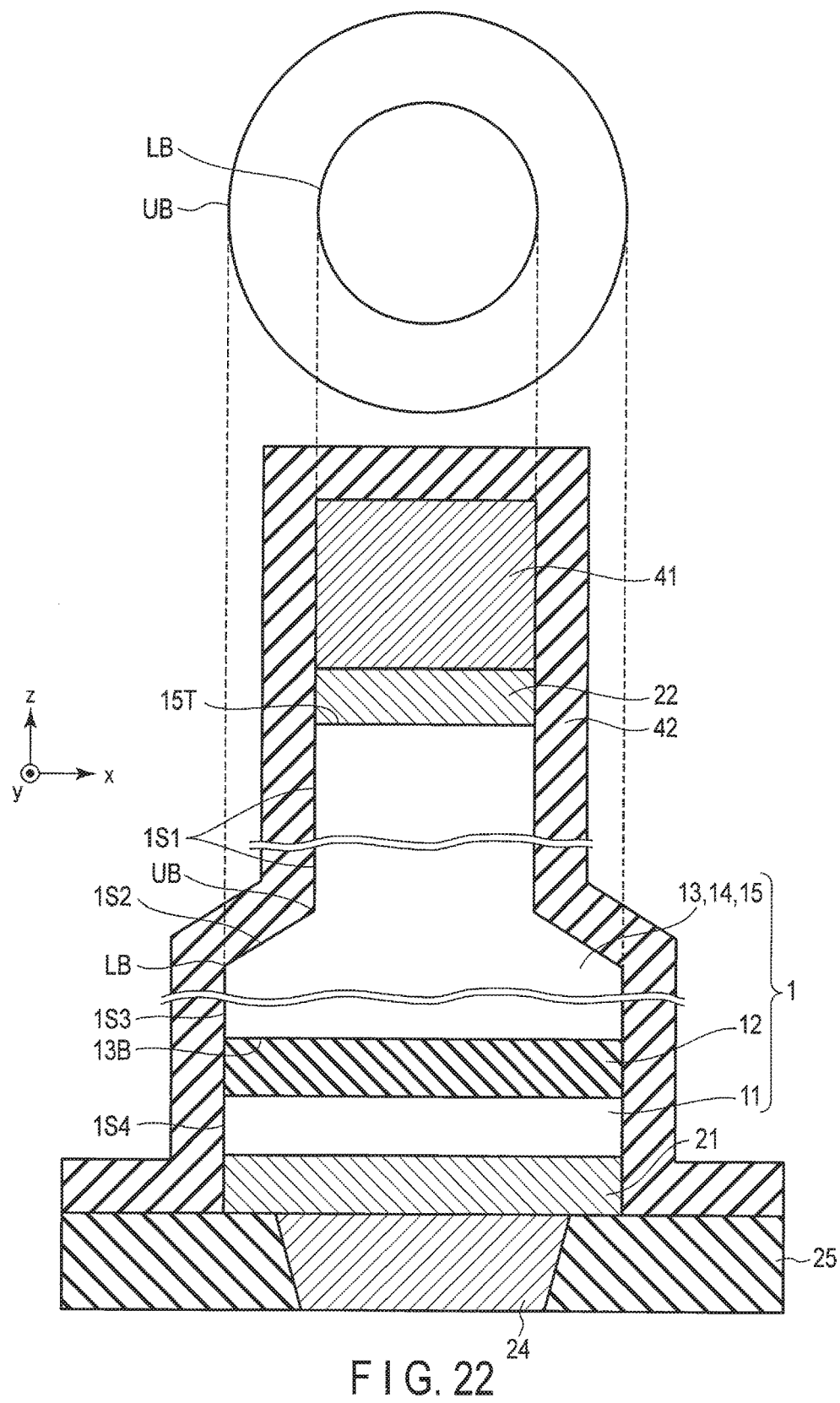
FIG. 22 illustrates a cross-section of the structure of a magnetoresistive effect element of a second embodiment.

FIG. 22 illustrates a cross-section of the structure of a magnetoresistive effect element 1 of the second embodiment. As illustrated in FIG. 22, the magnetoresistive effect element 1 includes a storage layer 11, an intermediate layer 12, a reference layer 13, a coupling layer 14, and a shift control layer 15, as in the first embodiment. However, the storage layer 11, the intermediate layer 12, the reference layer 13, the coupling layer 14, and the shift control layer 15 have different shapes from those in the first embodiment. The storage layer 11, the intermediate layer 12, the reference layer 13, the coupling layer 14, and the shift control layer 15 are stacked in this order from the bottom along the z-axis.

The magnetoresistive effect element 1 includes a side including a first section 1S1, a second section 1S2, a third section 1S3, and a fourth section 1S4. Hereinafter, the first section 1S1, the second section 1S2, the third section 1S3, and the fourth section 1S4 are referred to as a first side 1S1, a second side 1S2, a third side 1S3, and a fourth side 1S4, respectively.

The first side 1S1, the second side 1S2, the third side 1S3, and the fourth side are connected in this order, and are continuous. A bottom of the first side 1S1 is in contact with a top of the second side 1S2. A bottom of the second side 1S2 is in contact with a top of the third side 1S3. A bottom of the third side 1S3 is in contact with a top of fourth side 1S4.

The first side 1S1, the second side 1S2, and the third side 1S3 are the entire side of the set of the shift control layer 15, the coupling layer 14, and the reference layer 13. Specifically, each of the first side 1S1, the second side 1S2, and the third side 1S3 is made of the entirety or a part of the side of the shift control layer 15, the entirety or a part of the side of the coupling layer 14, and/or the entirety or a part of the side of the reference layer 13. The fourth side 1S4 is the side of the intermediate layer 12 and the storage layer 11.

The inclination of the second side 1S2 from the z-axis is larger than the inclination of the first side 1S1 from the z-axis and the inclination of the third side 1S3 from the z-axis. The first side 1S1, the third side 1S3, and the fourth side 1S4 are, for example, substantially parallel to the z-axis, and the second side 1S2 is not parallel to the z-axis.

The boundary between the first side 1S1 and the second side 1S2 is referred to as an upper boundary UB. The boundary between the second side 1S2 and the third side 1S3 is referred to as a lower boundary LB. The plane of the upper boundary UB along the xy-plane is smaller than the plane of the lower boundary LB along the xy-plane. For a case of the first side 1S1 and the third side 1S3 being substantially parallel to the z-axis, the cross-section along the xy-plane (to be referred to as an xy-cross-section hereinafter) of an area surrounded by the first side 1S1 is smaller than an xy-cross-section of an area surrounded by the third side 1S3.

The lower boundary LB is located above, along the z-axis, a bottom 13B of the reference layer 13. The upper boundary UB is located above, along the z-axis, the lower boundary LB, and below, along the z-axis, a top 15T of the shift control layer 15. In other words, the upper boundary UB and the lower boundary LB are located between the top 15T of the shift control layer 15, and a bottom 13B of the reference layer 13.

Sides of the cap layer 22 and the hard mask 41 are located on the extension of first side 1S1. The sides of the fourth side 1S4 and the base layer 21 are located, for example, on the extension of the third side 1S3, or may not be located thereon.

Thus, the magnetoresistive effect element 1 has the first side 1S1, the second side 1S2 with the inclination from the z-axis larger than the inclination of the first side 1S1 from the z-axis, and the third side 1S3 with the inclination from the z-axis smaller than the inclination of the second side 1S2 from the z-axis, and the upper boundary UB and the lower boundary LB are located between the top 15T of the shift control layer 15 and the bottom 13B of the reference layer 13. Therefore, the bottom 15B of the shift control layer 15 is smaller than the bottom 13B of the reference layer 13.

The FIG. 22 structure may be implemented in various forms as illustrated in FIGS. 23 to 27. FIGS. 23 to 27 illustrate cross-sections of first to fifth examples of the structure of the magnetoresistive effect element 1 of the second embodiment, respectively.

Figure 23:
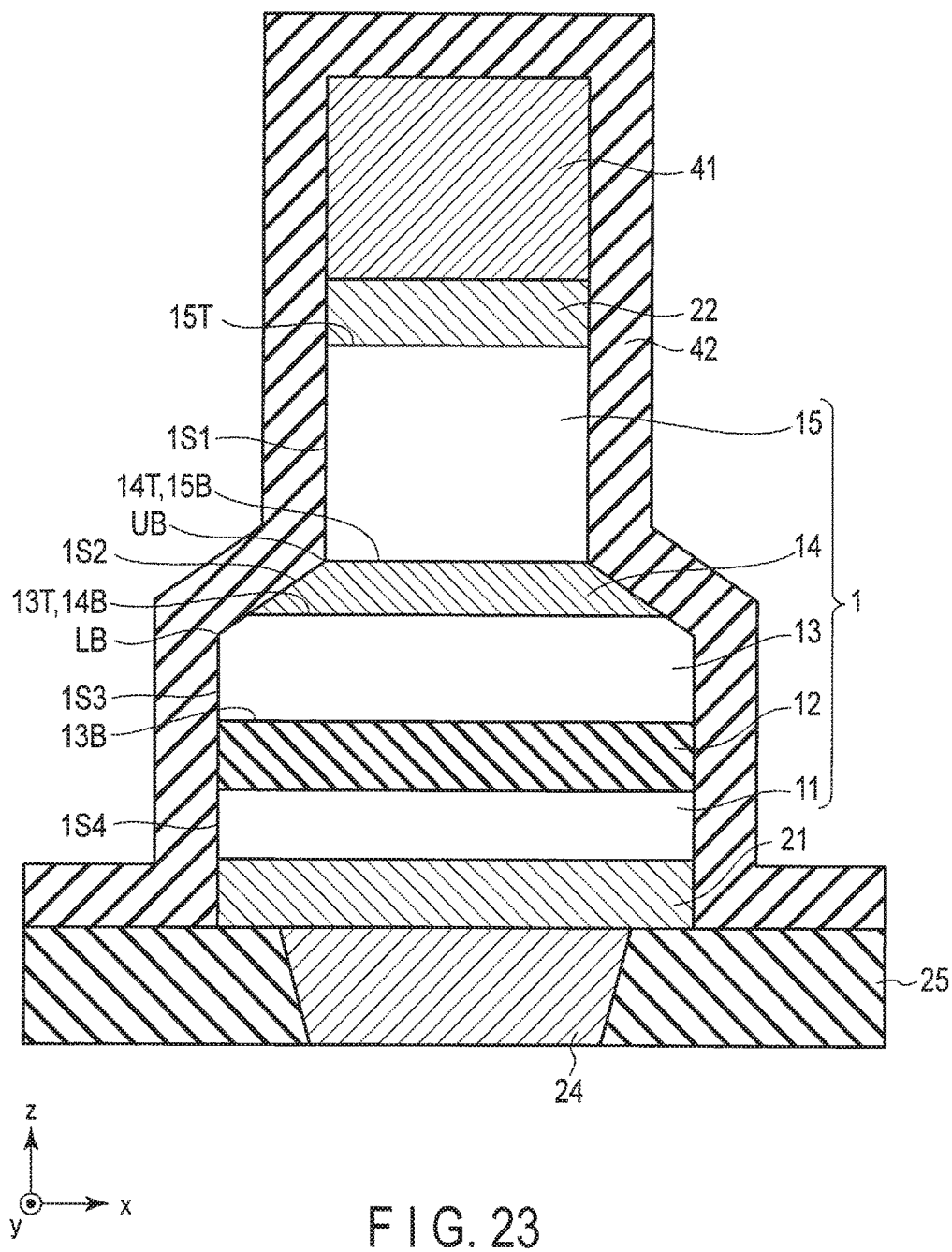
FIG. 23 illustrates a cross-section of a first example of the structure of the magnetoresistive effect element of the second embodiment.

In the FIG. 23 example, the plane of the upper boundary UB is a top 14T of the coupling layer 14, and the plane of the lower boundary LB is located between the top 13T and the bottom 13B of the reference layer 13. The first side 1S1 is made of the side of the shift control layer 15. The second side 1S2 is made of the side of the coupling layer 14, and an upper section of the side of the reference layer 13. The third side 1S3 is made of the remaining section of the side of the reference layer 13. The xy-cross-section of the shift control layer 15 and the top 14T of the coupling layer 14 are larger than the bottom 14B of the coupling layer 14, the bottom 13B of the reference layer 13, and the xy-cross-sections of the intermediate layer 12 and the storage layer 11.

Figure 24:
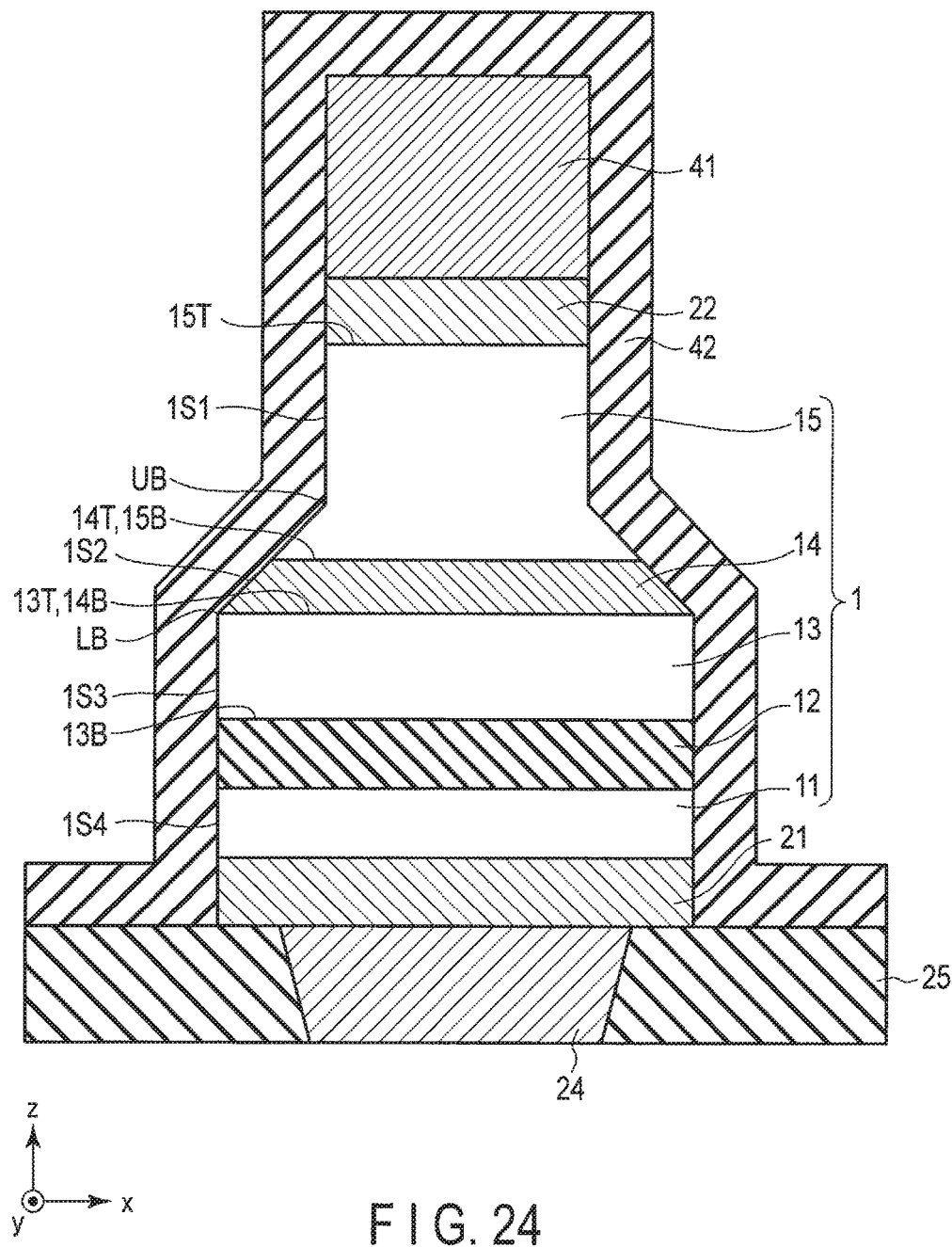
FIG. 24 illustrates a cross-section of a second example of the structure of the magnetoresistive effect element of the second embodiment.

In the FIG. 24 example, the plane of the upper boundary UB is located between the top 15T and the bottom 15B of the shift control layer 15, and the plane of the lower boundary LB is the bottom 14B of the coupling layer 14. The first side 1S1 is made of an upper section of the side of the shift control layer 15. The second side 1S2 is made of the remaining section of the side of the shift control layer 15, and the side of the coupling layer 14. The third side 1S3 is made of the side of the reference layer 13. The top 15T of the shift control layer 15 is smaller than the bottom 15B of the shift control layer 15, the bottom 14B of the coupling layer 14, and the xy-cross-sections of the reference layer 13, the intermediate layer 12, and the storage layer 11.

Figure 25:
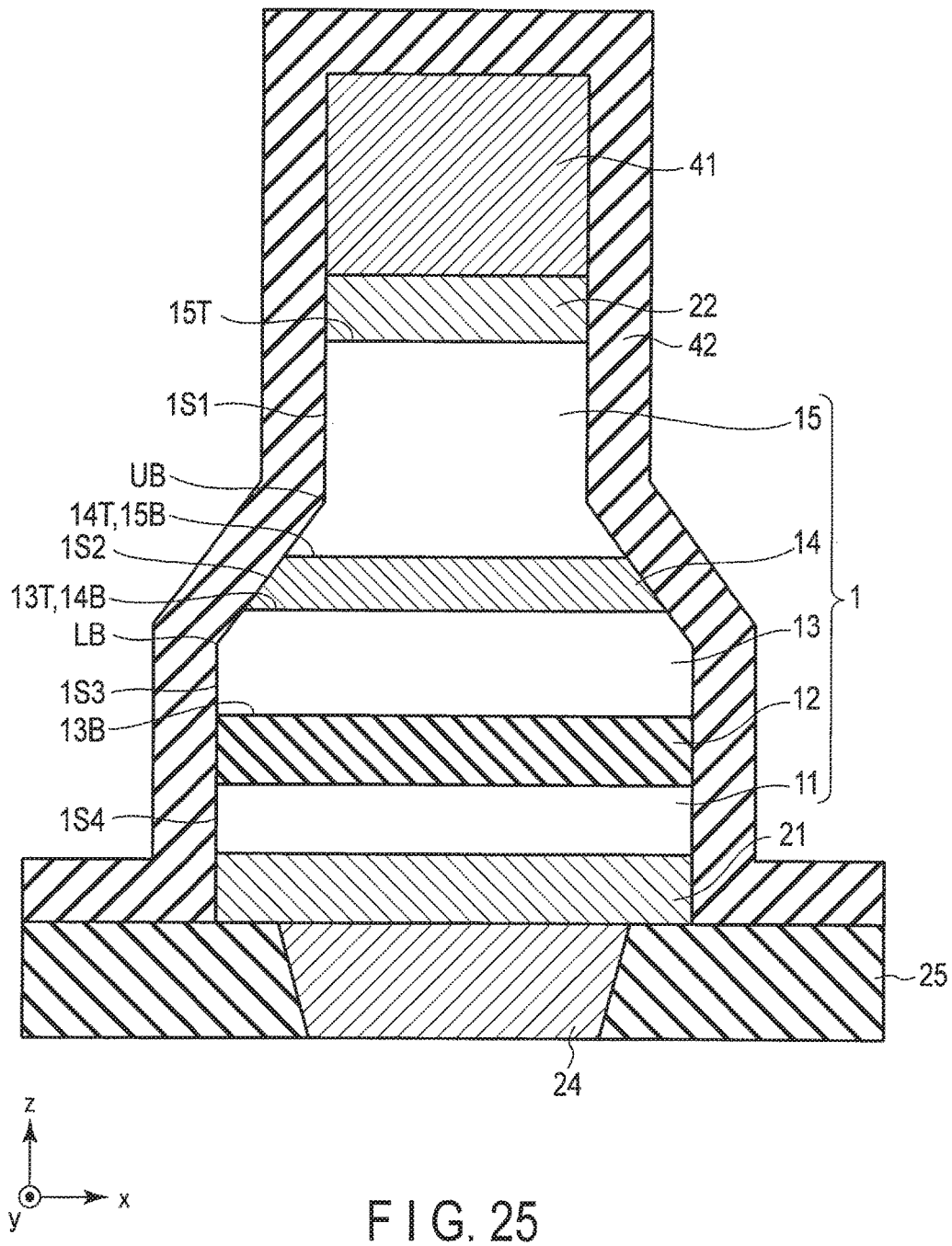
FIG. 25 illustrates a cross-section of a third example of the structure of the magnetoresistive effect element of the second embodiment.

In the FIG. 25 example, the plane of the upper boundary UB is located between the top 15T and the bottom 15B of the shift control layer 15, and the plane of the lower boundary LB is located between the top 13T and the bottom 13B of the reference layer 13. The first side 1S1 is made of an upper section of the side of the shift control layer 15. The second side 1S2 is made of the remaining section of the side of the shift control layer 15, the side of the coupling layer 14, and an upper section of the side of the reference layer 13. The third side 1S3 is made of the remaining section of the side of the reference layer 13. The top 15T of the shift control layer 15 is smaller than the bottom 15B of the shift control layer 15, the bottom 14B of the coupling layer 14, the bottom 13B of the reference layer 13, and the xy-cross-sections of the intermediate layer 12 and the storage layer 11.

Figure 26:
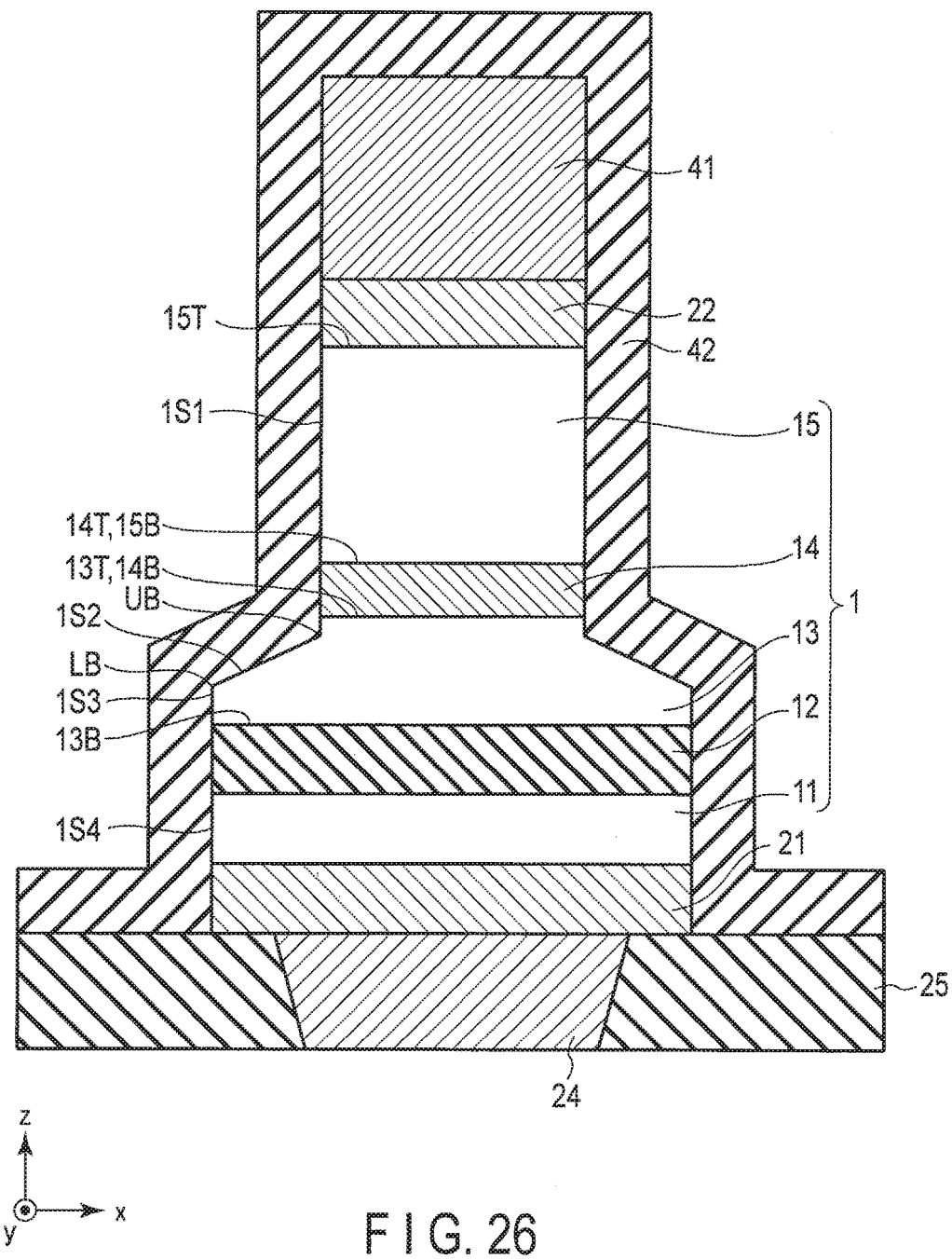
FIG. 26 illustrates a cross-section of a fourth example of the structure of the magnetoresistive effect element of the second embodiment.

In the FIG. 26 example, both the plane of the upper boundary UB and the plane of the lower boundary LB are located between the top 13T and the bottom 13B of the reference layer 13. The first side 1S1 is made of the sides of the shift control layer 15 and the coupling layer 14, and an upper section of the reference layer 13. The second side 1S2 is made of a middle section of the side of the shift control layer 15. The third side 1S3 is made of the remaining section of the side of the reference layer 13. The xy-cross-sections of the shift control layer 15 and the coupling layer 14, and the top 13T of the reference layer 13 are smaller than the xy-cross-sections of the bottom 13B of the reference layer 13, the intermediate layer 12, and the storage layer 11.

Figure 27:
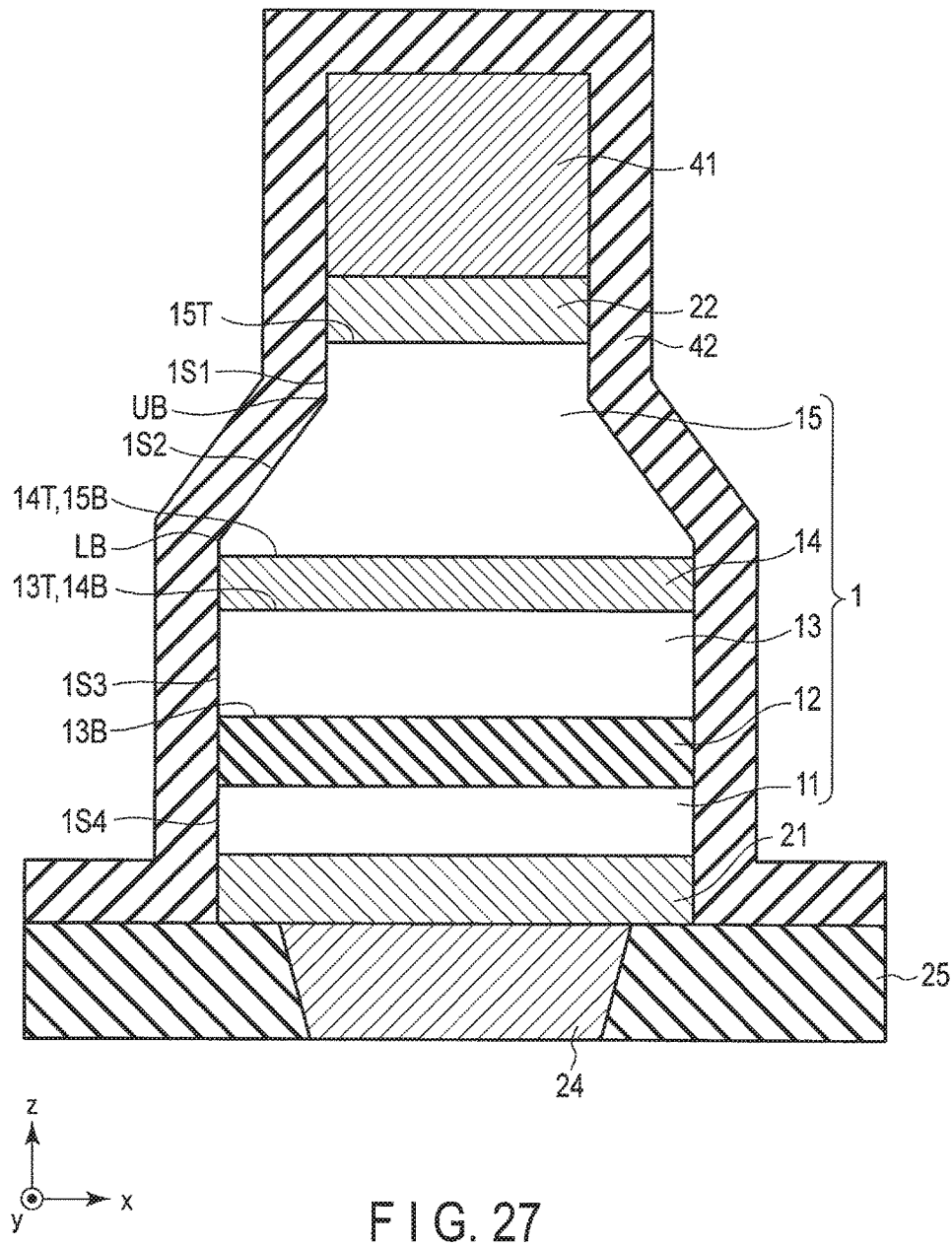
FIG. 27 illustrates a cross-section of a fifth example of the structure of the magnetoresistive effect element of the second embodiment.

In the FIG. 27 example, both the plane of the upper boundary UB and the plane of the lower boundary LB are located between the top 15T and the bottom 15B of the shift control layer 15. The first side 1S1 is made of an upper section of the side of the shift control layer 15. The second side 1S2 is made of a middle section of the side of the shift control layer 15. The third side 1S3 is made of the remaining section of the side of the shift control layer 15, and the sides of the coupling layer 14 and the reference layer 13. The top 15T of the shift control layer 15 is smaller than the bottom 15B of the shift control layer 15, and the xy-cross-sections of the coupling layer 14, the reference layer 13, the intermediate layer 12, and the storage layer 11.

The second magnetoresistive effect element 1 can be manufactured by the steps of the FIGS. 4, 11, and 12 in the method of manufacturing the magnetoresistive effect element 1 of the first embodiment. Specifically, after the FIG. 11 step, the IBE with the same conditions as FIG. 12 is performed. This IBE is continued until the upper boundary UB and the lower boundary LB are formed based on the structure intended to be formed among FIGS. 22 to 27. After the IBE, the insulator 42 is deposited.

Advantages

It is known that reversal of magnetization of a storage layer 111 of a general magnetoresistive effect element (stack of layers) 101 as in FIG. 20 includes two reversal modes: domain-wall-motion magnetization reversal and single-domain unisonous-rotation magnetization reversal.

In general, in the domain-wall-motion magnetization reversal, walls of magnetic domains whose magnetization has been reversed move, thereby the orientation of the magnetization of the storage layer 111 is reversed. For this reason, if the storage layer 111 includes many domain walls and many sites which trap the domain walls, the magnetization reversal may not occur (or, move forward). In addition, the domain walls in the storage layer 111 are easily influenced by the intensity and distribution of stray magnetic fields by the shift control layer 115 and the reference layer 113. Based on this, the stray magnetic fields in the storage layer 111 generated by the shift control layer 115 and the reference layer 113 generally have their intensities controlled to be substantially zero in their net values.

The intensities are thus controlled; however, in the case of domain-wall-motion magnetization reversal, failures of writes to the magnetoresistive effect element 101 are frequently observed. A reason for this is thought to result from the distribution of the stray magnetic fields generated in the storage layer 111 by the shift control layer 115 and the reference layer 113. The structure of FIG. 20 includes the storage layer 111, the reference layer 113, and the shift control layer 115 with the same shape along the xy-plane, and therefore magnetic lines of force from the whole bottom of the reference layer 113 and the whole bottom of the shift control layer 115 reach the storage layer 111. For this reason, the storage layer 111 is influenced over its whole xy-plane by the stray magnetic fields by both the reference layer 113 and the shift control layer 115.

Moreover, as can be seen from FIG. 18, the further a position in a magnetic line of force from a magnetic body, the larger the inclination of the magnetic line of force from the normal of a surface of the magnetic body. For this reason, the shift control layer 115 generates in the storage layer 111 magnetic lines of force with large inclinations from the z-axis, or from the magnetization orientation of the storage layer 111. This means that the stray magnetic field by the shift control layer 115 adversely affects the parallelism of the magnetization of the storage layer 111.

According to the second embodiment, the magnetoresistive effect element 1 has the first side 1S1, the second side 1S2 with the inclination from the z-axis larger than the inclination of the first side 1S1 from the z-axis, and the third side 1S3 with the inclination from the z-axis smaller than the inclination of the second side 1S2 from the z-axis, and the upper boundary UB and the lower boundary LB are located between the top 15T of the shift control layer 15 and the bottom 13B of the reference layer 13. Such a structure positions edges of the bottom 15B of the shift control layer 15 inside, along the xy-plane, the edges of the bottom 13B of the reference layer 13. This results in an area of the shift control layer 15 which generates a stray magnetic field in the storage layer 11 being smaller than the area in FIG. 20. This leads to influences on the storage layer 11 by the shift control layer 15 through the stray magnetic field being smaller than that in FIG. 20. Therefore, adjustment of the area of the bottom 15B of the shift control layer 15 can control the influence on the storage layer 11 by the stray magnetic field from the bottom 15B of the shift control layer 15. Using this, the area of the section which is easily affected by the stray magnetic field generated in the storage layer 11 by the reference layer 13 is controlled, which can control the distribution of the stray magnetic fields generated in the storage layer 11 by the shift control layer 15 and the reference layer 13. For example, change of distribution of the stray magnetic field can also be made sharp. As a result, failures of writes to the magnetoresistive effect element 1 can be suppressed through the controlled generation of the magnetic wall in the storage layer 11.

Furthermore, according to the second embodiment, a diameter of the reference layer 13 is smaller than that of the shift control layer 15, and therefore the combined stray magnetic field generated by the reference layer 13 and the shift control 15 can have a characteristic spatial distribution. Specifically, a stray magnetic field with a direction similar to the magnetization orientation of the reference layer 13 is generated in edge portions of the storage layer 11, whereas a stray magnetic field with the direction opposite the direction of the stray magnetic field by the shift control layer 15 is generated in a central portion of the storage layer 11. The magnetization reversal of the storage layer 11 is facilitated from its edges. Therefore, in a process of the magnetization orientation of the storage layer 11 being made from anti-parallel to parallel to that of the reference layer 13, the magnetic stray field generated in the storage layer 11 with the same direction as the magnetization orientation of the reference layer 13 facilitates the magnetization reversal of the storage layer 11 from antiparallel to parallel. This can reduce a failure of a write to the magnetoresistive effect element 1.

Furthermore, the structures of FIGS. 23, 24, 25, and FIG. 27 satisfy the condition 1, and the condition 2 and/or the condition 3 of the first embodiment. Therefore, the structures of FIGS. 23, 24, 25, and 27 can realize a magnetic field Hcexb at least larger than that in FIG. 21 as in the first embodiment, based on the principles described with reference to FIGS. 14 to 18.

Third Embodiment

The third embodiment relates to the shape of the magnetoresistive effect element 1, and its manufacturing method. The third embodiment is similar to the second embodiment in the partially inclined side of magnetoresistive effect element 1, and differs from the second embodiment in the position of the inclination.

(Structure)

Figure 28:
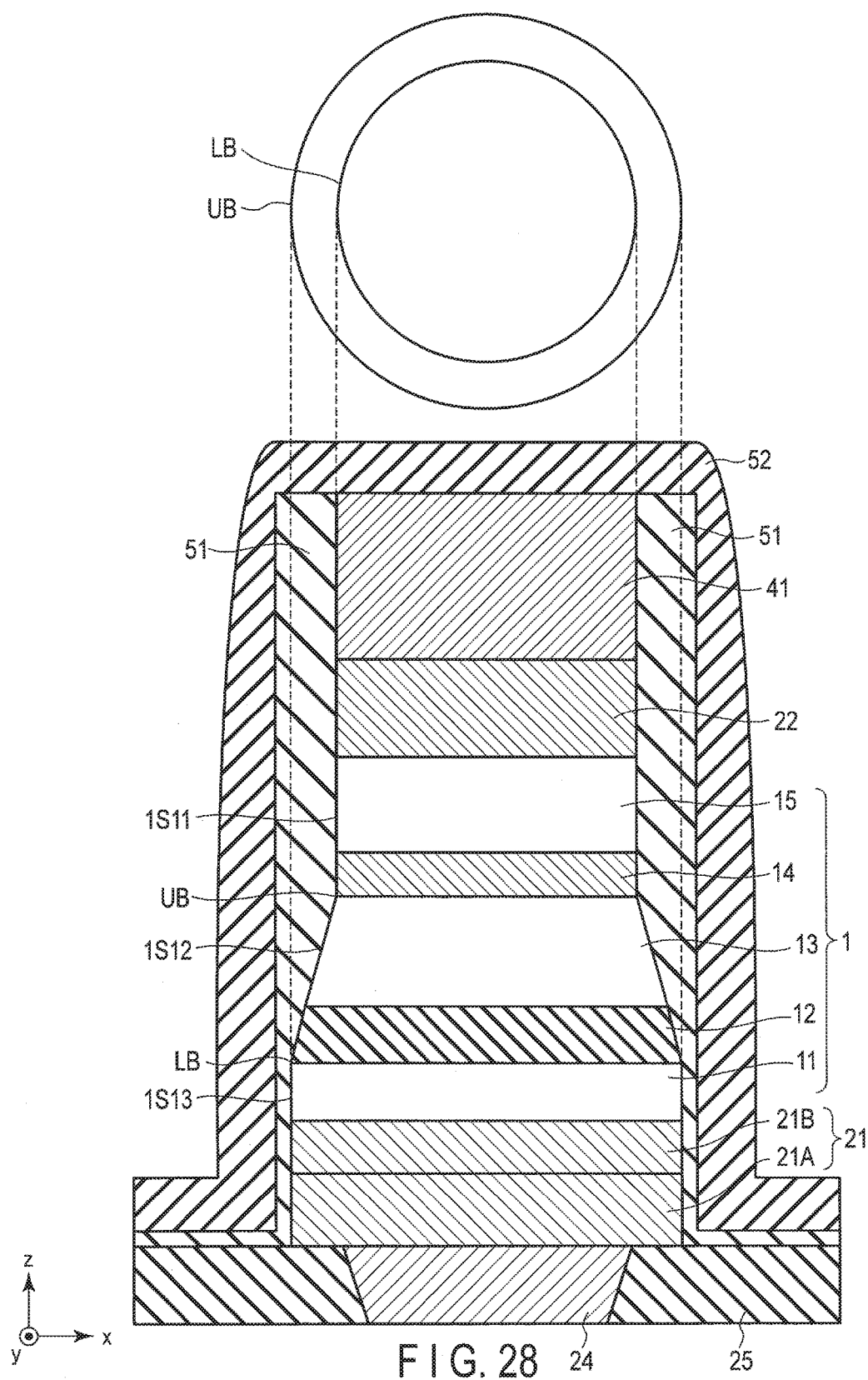
FIG. 28 illustrates a cross-section of an example of the structure of a magnetoresistive effect element of a third embodiment.

FIG. 28 illustrates a cross-section of an example of the structure of a magnetoresistive effect element 1 of the third embodiment. As illustrated in FIG. 28, the magnetoresistive effect element 1 includes a storage layer 11, an intermediate layer 12, a reference layer 13, a coupling layer 14, and a shift control layer 15, as in the first embodiment. However, the storage layer 11, the intermediate layer 12, the reference layer 13, the coupling layer 14, and the shift control layer 15 have different shapes from those in the first embodiment. The storage layer 11, the intermediate layer 12, the reference layer 13, the coupling layer 14, and the shift control layer 15 are stacked in this order from the bottom along the z-axis.

The magnetoresistive effect element 1 may include additional layers. FIG. 28 illustrates an example where the illustrated structure includes a base layer 21 and a cap layer 22 which sandwich the set of the layers 11 to 15, and a hard mask 41. The base layer 21 includes a layer 21A, and a layer 21B between the layer 21A and the storage layer 11. The layers 21A and 21B may be formed of the same material or different materials.

The magnetoresistive effect element 1 includes a side including a first section 1S11, a second section 1S12, and a third section 1S13. Hereinafter, the first section 1S11, the second section 1S12, and the third section 1S13 are referred to as a first side 1S11, a second side 1S12, and a third side 1S13, respectively.

The first side 1S11, the second side 1S12, and the third side 1S13 are connected in this order, and are continuous. A bottom of the first side 1S11 is in contact with a top of the second side 1S12. A bottom of the second side 1S12 is in contact with a top of third side 1S13. The first side 1S11 and the third side 1S13 extend along the z-axis, and are substantially parallel to the z-axis. In contrast, the second side 1S12 inclines from the z-axis, and has a larger inclination from the z-axis than inclinations of the first side 1S11 and third side 1S13 from the z-axis.

The boundary between the first side 1S11 and the second side 1S12 is referred to as an upper boundary UB. The boundary between the second side 1S12 and the third side 1S13 is referred to as a lower boundary LB. The upper boundary UB is located at least above, along the z-axis, a bottom of the reference layer 13. The lower boundary LB is located at least below, along the z-axis, a top of the intermediate layer 12.

FIG. 28 illustrates an example where the upper boundary UB is the boundary between the coupling layer 14 and the reference layer 13 and the lower boundary LB is the boundary between the intermediate layer 12 and the storage layer 11. The following description is based on this example. Because of such positions of the boundaries, the first side 1S11 is the entire side of the set of the shift control layer 15 and the coupling layer 14, the second side 1S12 is the entire side of the set of the reference layer 13 and the intermediate layer 12, and third side 1S13 is the side of the storage layer 11.

The plane shape of the area surrounded by the upper boundary UB is smaller than the plane shape of the area surrounded by the lower boundary LB. For a case of the first side 1S11 and third side 1S13 being substantially parallel to the z-axis, the xy-cross-section of an area surrounded by the first side 1S11 is smaller than the xy-cross-section of an area surrounded by the third side 1S13. The sides of the cap layer 22 and the hard mask 41 are located on the extension of the first side 1S11. The side of the base layer 21 is located, for example, on the extension of the third side 1S13, or may not be located thereon.

The magnetoresistive effect element 1 has its side covered by an insulator 51. The insulator 51 also covers a top of the interlayer insulator 25. Tops of the insulator 51 and the hard mask 41 are covered by an insulator 52.

(Manufacturing Process)

Referring to FIGS. 29 to 34, a manufacturing method of the structure illustrated in FIG. 28 will be described.

Figure 29:
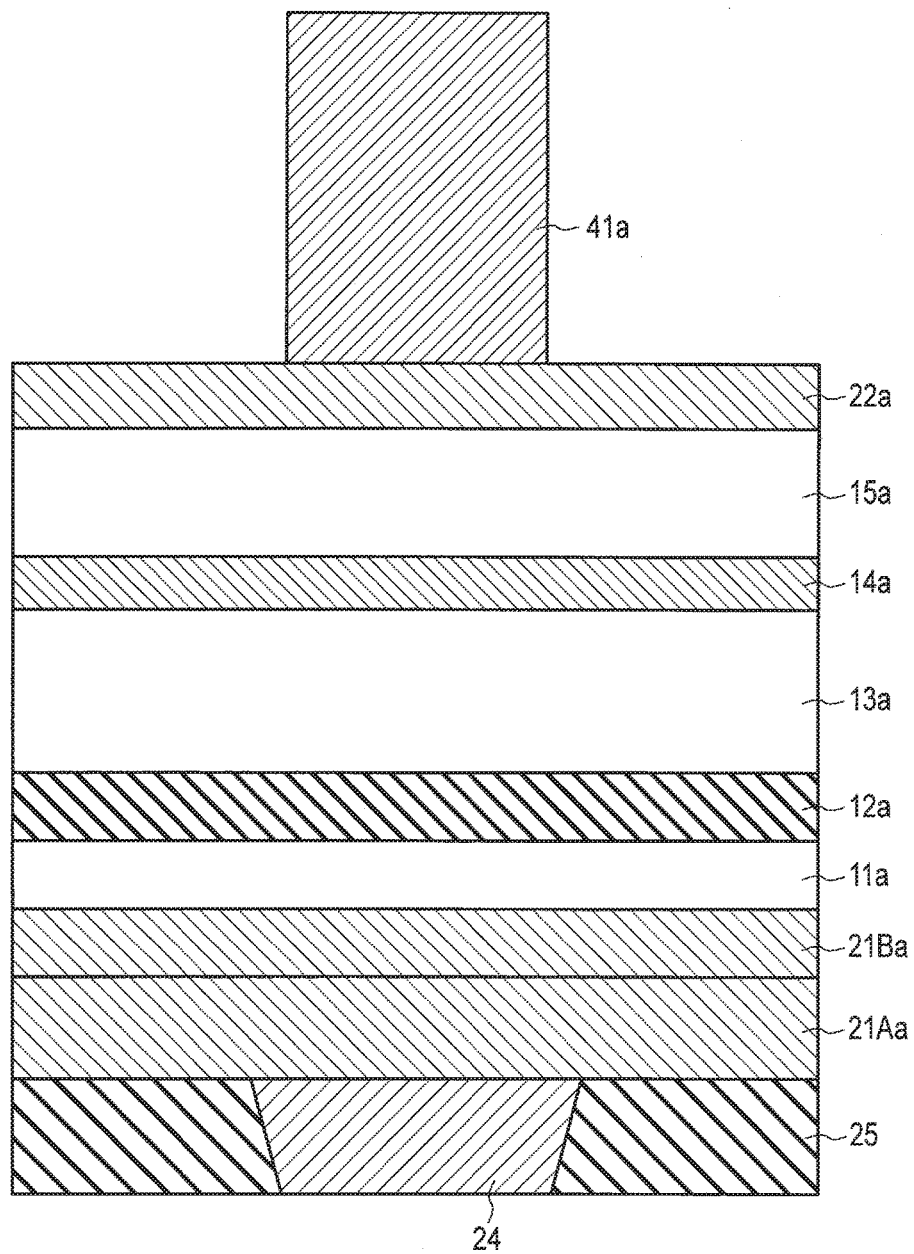
FIG. 29 illustrates one state in an example of the process of manufacturing the magnetoresistive effect element of the third embodiment.

As illustrated in FIG. 29, by the same process as that illustrated in FIG. 4, the interlayer insulator 25 and the lower electrode 24 are formed, layers 21a (layers 21Aa and 21Ba), 11a, 12a, 13a, 14a, 15a, and 22a are deposited one after another, and a hard mask 41a is formed on the layer 22a. A pattern of the hard mask 41a has the plane shape corresponding to the plane shape of the cap layer 22, the shift control layer 15, and the coupling layer 14.

Figure 30:
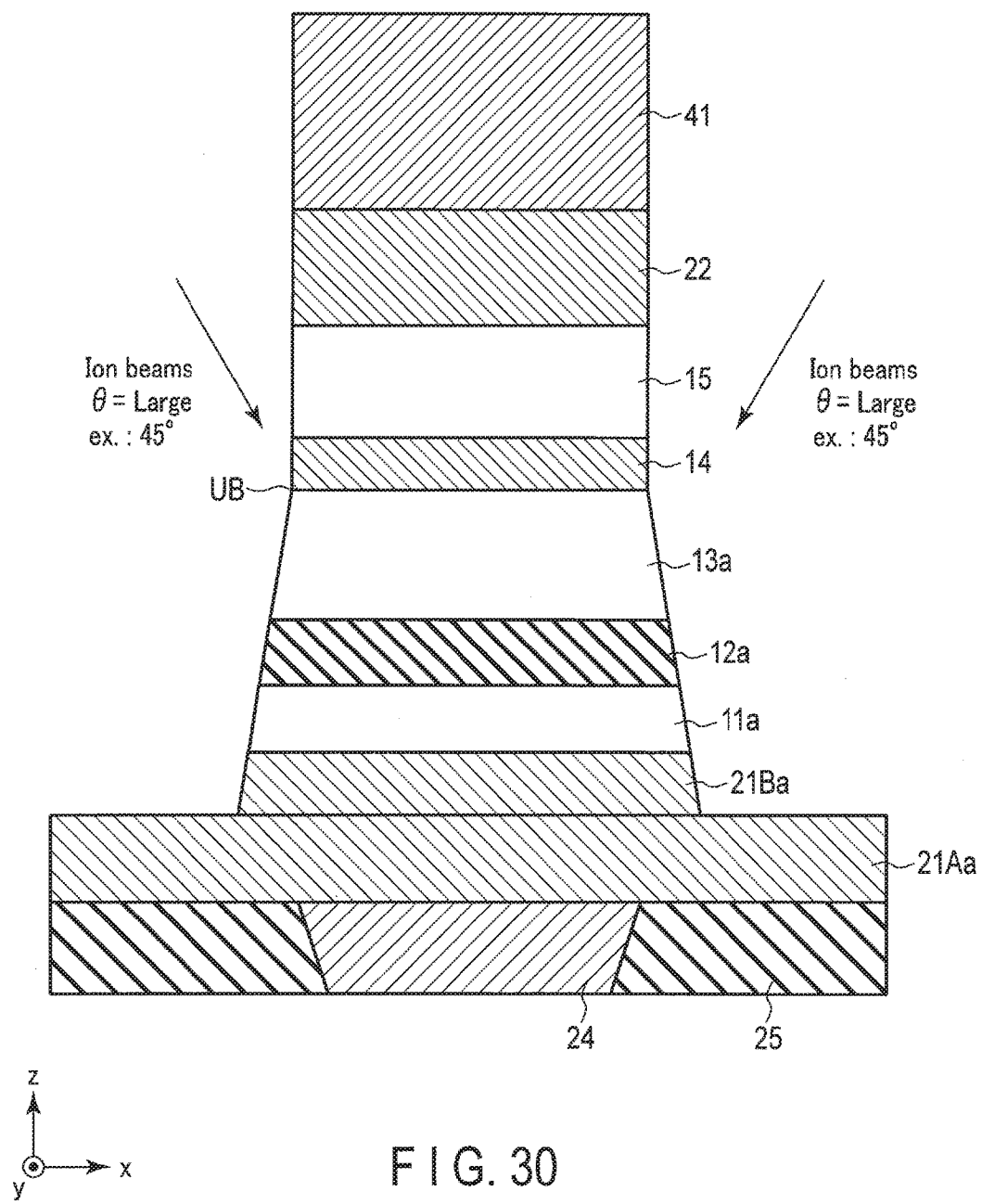
FIG. 30 illustrates the state subsequent to FIG. 29.

A first step IBE is performed. The first step IBE includes etching some upper layers in the structure illustrated in FIG. 29 using ion beams with a relatively large angle θ to the z-axis. The ion beams incline, for example, by 40° to 60° from the z-axis, and more specifically by 45°. As an example, the first step IBE includes etching the layers 22a, 15a, 14a, 13a, 12a, and 11a and 21Ba by ion beams inclined from the z-axis by 45°, using the hard mask 41a, as illustrated in FIG. 30. The etching of such conditions progresses while the plane shape of the hard mask 41a is being transferred to the layers 22a and layers below. The etching is continued until the plane shape of the hard mask 41a is transferred to the layers between a top of the layer 22a and the upper boundary UB, which is the boundary between the layers 14a and 13a. The FIG. 30 etching lowers the position of a top of the hard mask 41a. As a result, the hard mask 41, the cap layer 22, the shift control layer 15, and the coupling layer 14 are formed. The etching makes the layers 13a, 12a, and 11a and 21Ba tapered.

Figure 31:
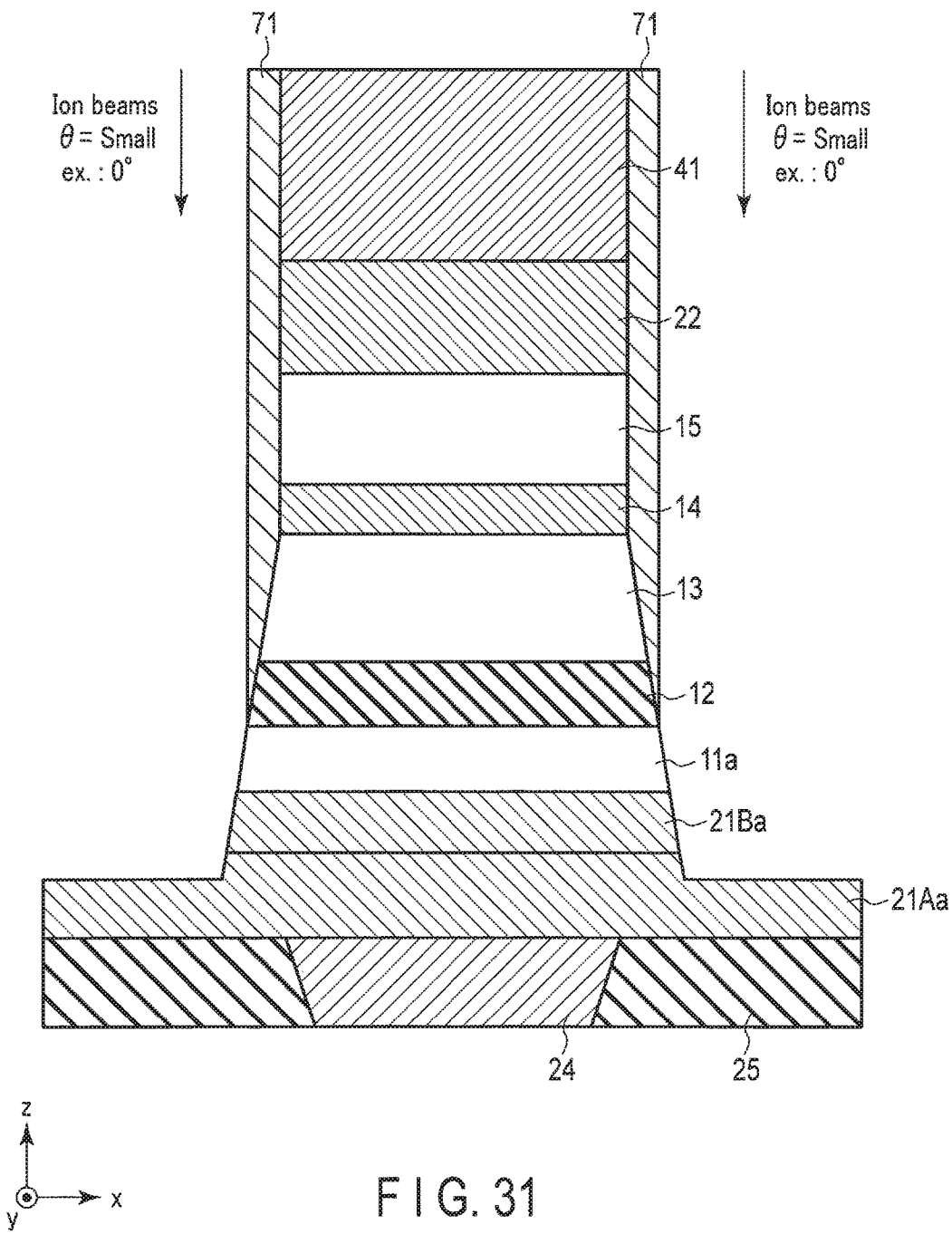
FIG. 31 illustrates the state subsequent to FIG. 30.

A second step IBE is performed. The second step IBE includes etching some layers below the layers subject to the first step IBE, using ion beams inclined from the z-axis by an angle different from that in the first step IBE. The angle θ of the ion beams of the second step IBE is desirably smaller than the angle θ of the ion beams of the first step IBE, preferably nearly parallel to the z-axis, is 0° to 20°, for example, and is specifically parallel to the z-axis. As an example, the second step IBE includes etching the layers 13a, 12a, and 11a, 21Ba, and 21Aa using the hard mask 41, as illustrated in FIG. 31. The etching of such conditions progresses while the plane shape of the hard mask 41a is being transferred to layers below the coupling layer 14. As a result, the layers 13a and 12a are etched, and the reference layer 13 and the intermediate layer 12 are formed.

Material etched off the layers by the FIG. 31 etching pile on the layers 41, 22, 15, 14, 13, 12, and 11a, 21Ba, etc. More specifically, the etched-off material pile on the sides of the layers 41, 22, 15, 14, 13, and 12, and form a redeposition layer 71. The redeposition layer 71 includes or is formed of the material etched off the layers 13a, 12a, and 11a, 21Ba, and 21Aa. Among the layers 13a, 12a, and 11a, 21Ba, and 21Aa, those other than layer 12a are metal, and conductive. Therefore, the redeposition layer 71 is mostly conductive, or has a low resistance.

The FIG. 31 etching is continued until the layer 12a is etched to be formed into the intermediate layer 12, for example. Alternatively, the FIG. 31 etching is stopped before the redeposition layer 71, especially its section on the side of the intermediate layer 12 becomes too thick.

Figure 32:
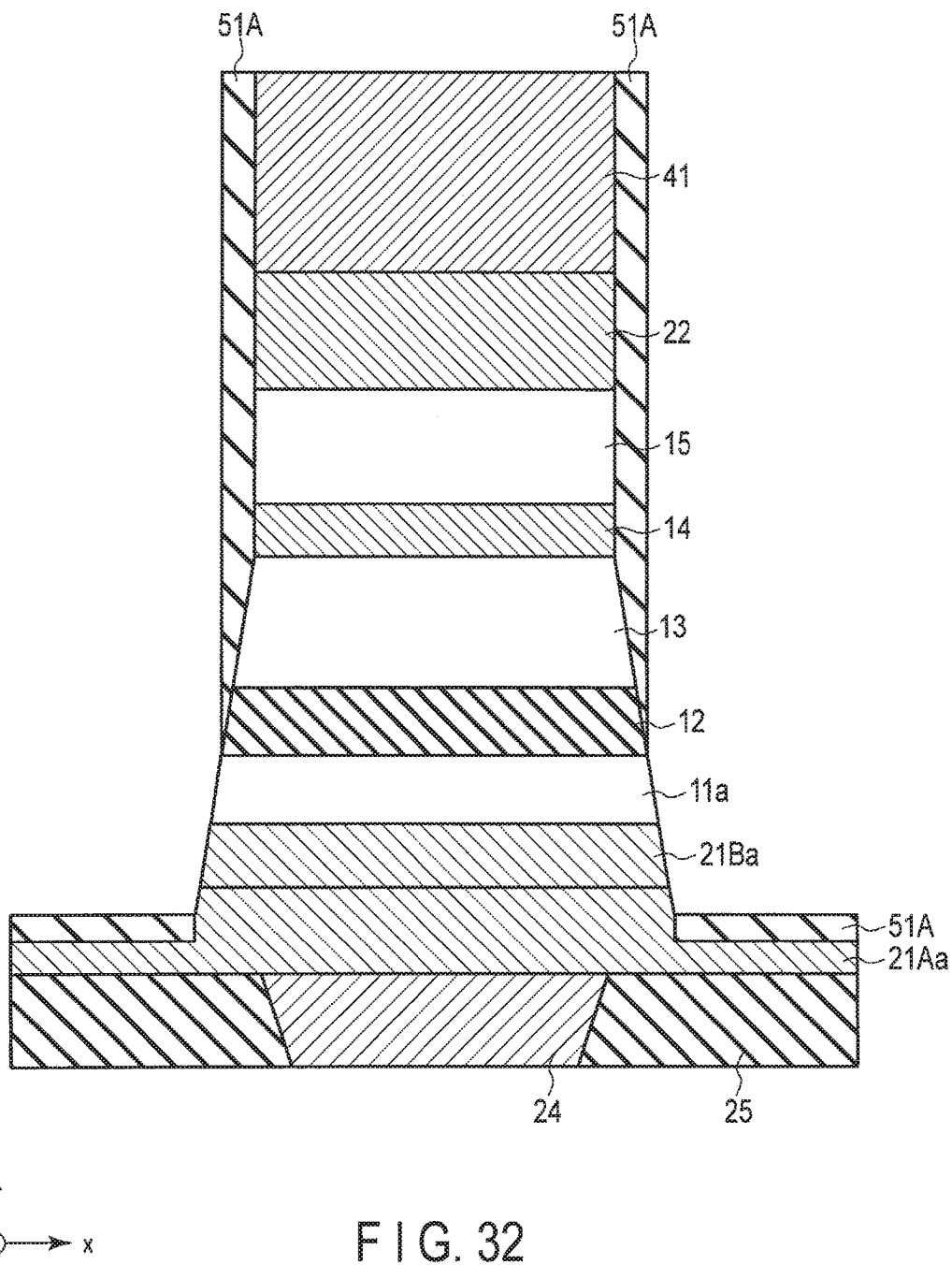
FIG. 32 illustrates the state subsequent to FIG. 31.

As illustrated in FIG. 32, the redeposition layer 71 is converted into an insulator. As an example, the redeposition layer 71 is oxidized and/or nitrided. To this end, for example, the redeposition layer 71 is made to contact a material, such as oxygen, carbon monoxide, carbon dioxide, water, nitrogen, and ammonia, and reacts with the material. The oxidation and/or nitridation of the redeposition layer 71 can include processing the redeposition layer 71 using one of materials or combination thereof in one or combination of a plasma, radical, high-pressure (one Torr or larger), and hot (at 200° C. or higher) atmosphere.

The FIG. 32 oxidation and/or nitridation is continued until at least a sufficiently large part of a section of the redeposition layer 12 on the side of the intermediate layer 12 becomes an oxide, nitride, or oxinitiride. Details are as follows. The section of the redeposition layer 71 on the intermediate layer 12 may serve as a current path which bypasses the intermediate layer 12. This can inhibit the magnetoresistive effect element 1 exhibiting through its magnetoresistive effect a resistance value change large enough to serve as a memory cell. This being taken into consideration, the oxidation and/or nitridation is continued until the section of the redeposition layer 71 on the intermediate layer 12 sufficiently loses its function as a current path. More specifically, the oxidation and/or nitridation is continued until the section of the redeposition layer 71 on the intermediate layer 12 becomes an oxide, nitride, or oxynitride with a resistance high enough to allow the magnetoresistive effect element 1 to exhibit a resistance value change necessary to serve as a memory cell. Specifically, an oxide, nitride, or oxynitride of the redeposition layer 71 does not need to be a complete insulator and is an oxide, nitride, or oxynitride with an amorphous-like structure, for example. Moreover, before the section of the redeposition layer 71 on the intermediate layer 12 becomes too thick to be converted into an oxide, nitride, or oxynitride of such a high resistance, the preceding IBE of FIG. 31 is stopped.

As a result of the conversion into the insulator, an insulator 51A is obtained. The insulator 51A is a part of the insulator 51. A part of a surface of the layer 21Aa also becomes the insulator 51A.

As illustrated in FIG. 33, the second step IBE is performed again. The second step IBE of FIG. 33 progresses while the plane shapes of the hard mask 41a and the insulator 51A are being transferred to the layers 11a, 21Ba, and 21Aa. As a result, the layers 11a and 21Ba are etched, and the storage layer 11 and the base layer 21B are formed. This completes the magnetoresistive effect element 1 of the shape illustrated in FIG. 28.

The substances etched off the layers by the etching pile on the insulator 51A and the sides of layers 11, 21B, and 21Aa, and form a redeposition layer 73, as in the second step IBE of FIG. 31. The redeposition layer 73 includes or is formed of materials etched off the layers 11a, 21Ba, and 21Aa. The layers 11a, 21Ba, and 21Aa are metal, and conductive or semiconductive. Therefore, the redeposition layer 72 is conductive or semiconductive.

Figure 34:
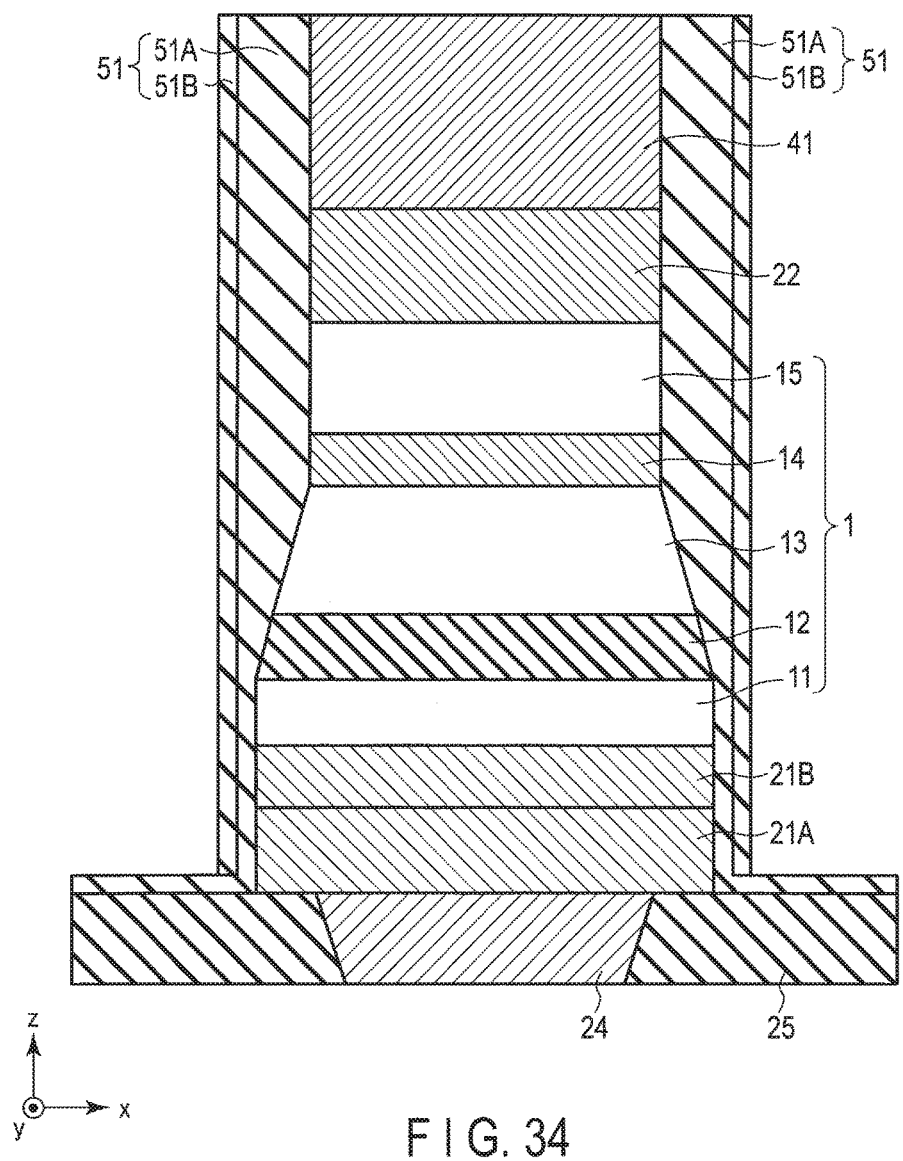
FIG. 34 illustrates the state subsequent to FIG. 33.

As illustrated in FIG. 34, the redeposition layer 73 is converted into an insulator. The conversion into an insulator in FIG. 34 can be performed by the same step as that for conversion into an insulator in FIG. 32, and includes oxidation and/or nitridation. As a result of the oxidation and/or nitridation, an insulator 51B is obtained. The insulator 51B makes a part of the insulator 51, does not need to be an complete insulator, and is an oxide, nitride, or oxynitride with an amorphous-like structure, for example. A section of the layer 21Aa on the interlayer insulator 25 also becomes the insulator 51B. Thus, the insulator 51 is obtained.

The FIG. 34 oxidation and/or nitridation is continued until at least a sufficiently large part of a section of the redeposition layer 73 on the side of the intermediate layer 12 becomes an oxide, nitride, or oxynitride. The reason for this is the same as that described for the FIG. 32 oxidation and/or nitridation. Specifically, the oxidation and/or nitridation is continued until the section of the redeposition layer 73 on the intermediate layer 12 becomes an oxide, nitride, or oxynitride of a resistance high enough not to serve as a current path which inhibits the function of the magnetoresistive effect element 1 as a memory cell.

As described, a repetition of the second step IBE gradually processes the shapes of the layers 13a, 12a, and 11a, 21Ba, and 21Aa, leading to formation of the layers 13, 12, 11, and 21. Moreover, in order to address inevitable formation of the redeposition layers (71 or 73, etc.) by the second step IBE, redeposition layers are oxidized and/or nitrided by plural respective sets of oxidation and/or nitridation after plural second step IBEs. Each second step IBE is stopped before the redeposition layer resulting from that second step IBE becomes too thick to be sufficiently oxidized and/or nitrided by the following oxidation and/or nitridation. This set of gradual shape-formation and oxidation and/or nitridation is repeated so that formation of the layers 13, 12, 11, and 21 of desired shapes and sufficient oxidation and/or nitridation of the section of the redeposition layer on the side of the intermediate layer 12 (until a high enough resistance assumed) are both achieved. The description has been given of two repeats of the set of the second step IBE and oxidation and/or nitridation; however three or more repeats of the set may be performed.

The insulator 52 is then formed on the surface of the structure obtained by the processes so far, which completes the structure of FIG. 28.

Advantages

The layers 13a, 12a, and 11a, 21Ba, and 21Aa illustrated in FIG. 30 can be processed into the layers 13, 12, 11, and 21 of desired shapes by one IBE using the ion beams of an angle substantially parallel to the z-axis. In this case, the obtained structure has its surface oxidized and/or nitrided after the shaping. The oxidation and/or nitridation is intended to oxidize and/or nitride a redeposition layer, which is generated by the IBE and located on the side of the structure. The redeposition layer formed by one IBE is, however, thick, and therefore may not be sufficiently oxidized and/or nitrided. As a result, the conductive (or, low resistance) redeposition layer mostly remains. The remaining redeposition layer may serve as a current path. The layers 41, 22, 15, 14, 13, 11, and 21 are metal and conductive, and therefore the current path by the redeposition layer does not inhibit functions which those layers should have. In contrast, the intermediate layer 12 is insulative, and therefore such a current path of the redeposition layer can inhibit the intermediate layer 12 from exerting a function which it should exhibit. This can impede the exertion of the magnetoresistive effect by the magnetoresistive effect element 1, and can inhibit the magnetoresistive effect element 1 from serving as a memory cell.

According to the third embodiment, the IBE which gradually brings the shapes of the layers 13a, 12a, and 11a, 21Ba, and 21Aa close to the layers 13, 12, 11, and 21 of desired shapes (i.e., the second step IBE), and the oxidation and/or nitridation of the redeposition layer resulting from the IBE are alternately repeated. For this reason, the conductive redeposition layer (71 or 73, etc.) formed by the IBE is thin upon oxidation and/or nitridation, and therefore it can be oxidized and/or nitrided in its large portion. This can sufficiently convert the redeposition layer formed by every IBE into an oxide, nitride, or oxynitride with a sufficiently high resistance. This can suppress a layer on the side of the intermediate layer 12 after completion of the layers 13, 12, 11, and 21 from serving as a current path which bypasses the intermediate layer 12. Therefore, the intermediate layer 12 can exhibit the function it should exhibit, which allows the magnetoresistive effect element 1 to serve as a memory cell.

Moreover, according to the third embodiment, the layers 41a, 22a, 15a, and 14a are etched by the ion beams inclined from the z-axis by 40° to 60°. For this reason, shadow effects, which are features inherent to the IBE, are suppressed to the minimum, and the layers 41a, 22a, 15a, and 14a can be etched more efficiently than in the case of etching with ion beams inclined less from the z-axis.

Moreover, according to the third embodiment, the layers 12a and 11a are etched by the ion beams inclined from the z-axis by 0° to 20°. IBE with ion beams with a small inclination causes less damage to the side of a layer being etched than in the case with IBE with ion beams with a large inclination, and a reachable depth of damage is about half a reachable depth in the case with ion beams with a large inclination, and about 1 to 1.5 nm from a surface of the side of a layer being etched. For this reason, the layers 12a and 11a suffer from less damage than when they are etched in the first step IBE. This can form a high quality intermediate layer 12 and storage layer 11, and in turn provide the magnetoresistive effect element 1 with high performance. This is because the performance of the magnetoresistive effect element 1 is mainly determined by the performance of the intermediate layer 12 and the storage layer 11.

Modification

The description so far relates to an example where a redeposition layer is oxidized and/or nitrided to be converted into an insulator by a step separate from a second step IBE. A second step IBE and oxidation and/or nitridation may be performed in parallel and concurrently. Specifically, a second step IBE may be performed in an oxidizing and/or nitriding gas atmosphere, instead of the usual inert gas atmosphere. More specifically, the FIG. 31 process is performed in an oxidizing and/or nitriding atmosphere, which results in the structure of FIG. 32 without the redeposition layer 71 yet to be oxidized and/or nitrided being formed. Similarly, the FIG. 33 process is performed in an oxidizing and/or nitriding atmosphere, which results in the structure of FIG. 34 without the redeposition layer 73 yet to be oxidized and/or nitrided being formed.

Example of Application

Figure 35:
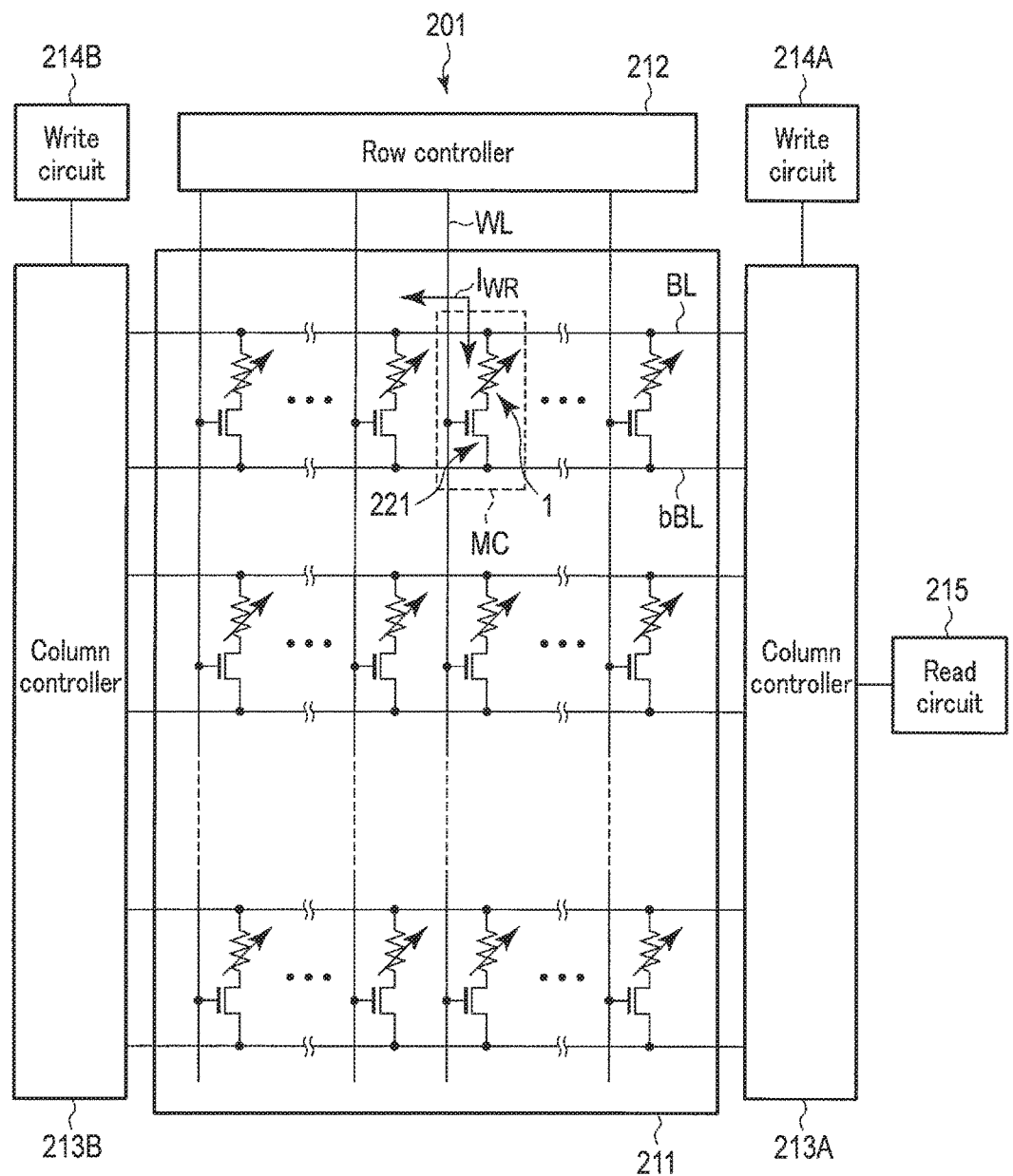
FIG. 35 illustrates functional blocks of a memory device of one embodiment.

The magnetoresistive effect element 1 of the first to third embodiments can be used as, for example, memory cells of a magnetoresistive random access memory (MRAM). FIG. 35 illustrates functional blocks of an MRAM 201. The MRAM 201 includes a memory cell array 211, a row controller 212, column controllers 213A and 213B, write circuits 214A and 214B, and a read circuit 215.

The memory cell array 211 includes plural memory cells MC arranged in a matrix. Each memory cell MC includes the magnetoresistive effect element 1 and a select switch 221 coupled in series. The switch 221 is a field-effect transistor, for example. The memory cell array 211 is provided with word lines WL and pairs of bit lines BL and bBL. The control electrodes of select switches 221 of memory cells MC of the same row are coupled to one word line WL. Memory cells MC of the same column are coupled between a pair of bit lines BL and bBL.

The row controller 212 receives a row address and activates (or makes high, for example) one word line WL specified by the row address. The activated word line WL turns on respective select switches 221 of the memory cells MC coupled to that word line WL. The column controllers 213A and 213B receive a column address, and couple one or more bit line pairs BL and bBL specified by the column address to the write circuits 214A and 214B and the read circuit 215. The row address and the column address specify one or more memory cells MC for read or write.

The read circuit 215 determines the data stored at the read-target memory cells MC based on the state of the elements 1 of the read-target memory cells MC. Specifically, the read circuit 215 determines whether the magnetization orientation of the storage layer 11 and the reference layer 13 of the element 1 of a read-target memory cell MC are parallel or anti-parallel. To this end, the read circuit 215 applies voltages to the target element 1, and compares the magnitude of the resultant current through the element 1 with a particular reference. When the current is larger than a reference, it is determined that the magnetization orientation of the storage layer 11 and the reference layer 13 of the element 1 is parallel, and, therefore, the element 1 is in the state of lower resistance. In contrast, when the current is smaller than the reference, it is determined that the magnetization orientation of the storage layer 11 and the reference layer 13 of the element 1 is anti-parallel, and, therefore, the element 1 is in the state of higher resistance. The state of lower resistance is treated as a state where "0" data is stored, and the state of higher resistance is treated as a state where "1" data is stored, for example.

The write circuits 214A and 214B apply voltages to a selected one or ones of bit line pairs BL and bBL in conjunction. The application of the voltages results in a write current flowing through the element 1 of a write-target memory cell MC. A write current has a direction and a magnitude determined based on data to be written in an element 1. The write circuits 214A and 214B apply a voltage in a direction based on the data to be written at a selected bit line pair BL and bBL. When a current IWR of a certain magnitude flows through an element 1 from the storage layer 11 to the reference layer 13, the element 1 transitions to the higher resistance state. In contrast, when a current IWR of a magnitude flows through an element 1 from the reference layer 13 to the storage layer 11, the element 1 transitions to the lower resistance state.

FIG. 36 illustrates a cross-section of an example of structures of one memory cell MC and associated components. FIG. 36 illustrates the magnetoresistive effect element 1 of the FIG. 1 structure of the first embodiment as an example. As illustrated in FIG. 36, insulators 232 are provided on the surface of a substrate 231 of silicon. The insulators 232 surround an element region 233 of the substrate 231, and separate plural element regions 233 from each other.

A select switch (transistor) 221 is provided in the element region 233. The select transistor 221 includes a gate electrode 241, a gate insulator 242, source or drain areas 243 and 244. The gate electrode 241 is provided in the substrate 231, and has its top covered with an insulator 245. The sides of the gate electrode 241 and the insulator 245 are covered with a gate insulator 242. The source or drain areas 243 and 244 are located in the surface of the substrate 231, and are located in the both sides of the gate electrode 241, respectively.

The source or drain area 243 is coupled to the bottom of a contact (plug) 251. The top of the contact 251 is coupled to a conductor (not shown), which serves as a bit line bBL.

The source or drain area 244 is coupled to the bottom of a lower electrode 24. The top of the shift control layer 15 is coupled to a conductor 253 via a conductor, such as the cap layer 22 and the hard mask 41. The conductor 253 serves as a bit line BL. An area free from components is provided with an interlayer insulator (not shown).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A magnetoresistive effect element comprising:
   a first magnetic layer;
   a nonmagnetic layer above the first magnetic layer;
   a second magnetic layer above the nonmagnetic layer;
   a metal layer above the second magnetic layer, the metal layer comprising at least one of ruthenium, rhodium, osmium, and platinum; and
   a third magnetic layer above the metal layer, the third magnetic layer being antiferromagnetically coupled with the second magnetic layer, an area of a bottom of the third magnetic layer being larger than an area of a top of the third magnetic layer, an angle between the top of the third magnetic layer and a side of the third magnetic layer being larger than an angle between a top of the second magnetic layer and a side of the second magnetic layer, and an angle between the bottom of the third magnetic layer and the side of the third magnetic layer being smaller than an angle between the bottom of the second magnetic layer and the side of the second magnetic layer, wherein:
   the side of the second magnetic layer has substantially the same angle to a first axis from the top of the second magnetic layer to the bottom of the second magnetic layer, the side of the third magnetic layer has substantially the same angle to the first axis from the top of the third magnetic layer to the bottom of the third magnetic layer, and the angle of the side of the third magnetic layer is larger than the angle of the side of the second magnetic layer.

2. The element according to claim 1, wherein:
the second magnetic layer has a larger coercivity than a coercivity of the first magnetic layer.

3. The element according to claim 2, wherein:
the third magnetic layer has a larger coercivity than the coercivity of the second magnetic layer.

4. A magnetoresistive effect element comprising:
a first magnetic layer;
a nonmagnetic layer above the first magnetic layer;
a second magnetic layer above the nonmagnetic layer, the second magnetic layer having a larger coercivity than a coercivity of the first magnetic layer;
a metal layer above the second magnetic layer; and
a third magnetic layer above the metal layer, an area of a bottom of the third magnetic layer being larger than an area of a top of the third magnetic layer, and an angle between the top of the third magnetic layer and a side of the third magnetic layer being larger than an angle between a top of the second magnetic layer and a side of the second magnetic layer or an angle between the bottom of the third magnetic layer and the side of the third magnetic layer being smaller than an angle between the bottom of the second magnetic layer and the side of the second magnetic layer.

5. The element according to claim 4, wherein:
the third magnetic layer has a larger coercivity than the coercivity of the second magnetic layer.

6. The element according to claim 4, wherein:
the side of the second magnetic layer has substantially the same angle to a first axis from the top of the second magnetic layer to the bottom of the second magnetic layer,
the side of the third magnetic layer has substantially the same angle to the first axis from the top of the third magnetic layer to the bottom of the third magnetic layer, and
the angle of the side of the third magnetic layer is larger than the angle of the side of the second magnetic layer.

* * * * *